United States Patent
Kitahara

(10) Patent No.: US 8,281,220 B2
(45) Date of Patent: Oct. 2, 2012

(54) APPARATUS FOR DETECTING AND RECOVERING FROM DATA DESTRUCTION CAUSED IN AN UNACCESSED MEMORY CELL BY READ, AND METHOD THEREFOR

(75) Inventor: Jun Kitahara, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 1245 days.

(21) Appl. No.: 11/968,724

(22) Filed: Jan. 3, 2008

(65) Prior Publication Data
US 2008/0288814 A1 Nov. 20, 2008

(30) Foreign Application Priority Data
May 16, 2007 (JP) .................................. 2007-130379

(51) Int. Cl.
G11C 29/00 (2006.01)
G11C 11/34 (2006.01)
G11C 16/06 (2006.01)

(52) U.S. Cl. ........ 714/764; 714/721; 714/723; 714/773; 365/185.09

(58) Field of Classification Search .................... None
See application file for complete search history.

(56) References Cited

U.S. PATENT DOCUMENTS

| | | | | |
|---|---|---|---|---|
| 6,151,246 A * | 11/2000 | So et al. | ................... | 365/185.09 |
| 7,397,697 B2 * | 7/2008 | So et al. | ................... | 365/185.09 |
| 7,559,004 B1 * | 7/2009 | Chang et al. | ................... | 714/758 |
| 7,778,077 B2 * | 8/2010 | Gorobets et al. | ......... | 365/185.09 |
| 2004/0003337 A1 * | 1/2004 | Cypher | .......................... | 714/763 |
| 2006/0209609 A1 * | 9/2006 | Kern | ............................. | 365/218 |
| 2006/0245248 A1 * | 11/2006 | Hu | ............................ | 365/185.09 |
| 2006/0268608 A1 | 11/2006 | Noguchi et al. | | |
| 2008/0279005 A1 * | 11/2008 | France | ..................... | 365/185.11 |
| 2009/0055680 A1 * | 2/2009 | Honda et al. | ...................... | 714/5 |
| 2009/0132875 A1 * | 5/2009 | Kitahara et al. | .............. | 714/721 |
| 2009/0144598 A1 * | 6/2009 | Yoon et al. | ..................... | 714/752 |
| 2010/0251066 A1 * | 9/2010 | Radke | .......................... | 714/752 |
| 2011/0022932 A1 * | 1/2011 | Radke | .......................... | 714/763 |
| 2011/0087832 A1 * | 4/2011 | Biswas et al. | ................ | 711/103 |

FOREIGN PATENT DOCUMENTS
JP 2004-326867 11/2004
* cited by examiner

*Primary Examiner* — Ajay Bhatia
*Assistant Examiner* — Daniel McMahon
(74) *Attorney, Agent, or Firm* — Brundidge & Stanger, P.C.

(57) ABSTRACT

Read error in a flash memory destroys data that is not requested to be read, and an efficient read disturb check method is therefore needed. In addition, data may be destroyed beyond repair by error correction before a read error check is run. A non-volatile data storage apparatus including a plurality of memory cells and a memory controller, in which the memory controller is configured to: count how many times data read processing has been executed in memory cells within the management area; read, when the data read processing count that is counted for a first management area exceeds a first threshold, data and an error correction code that are stored in the memory cells within the first management area; decode the read error correction code; and write the data corrected by decoding the error correction code in other management areas than the first management area.

18 Claims, 17 Drawing Sheets

LOGICAL ADDRESS-PHYSICAL ADDRESS CONVERSION TABLE

| | 1201 | 1202 | 1203 | 1200 |
|---|---|---|---|---|
| | LOGICAL ADDRESS a | PHYSICAL ADDRESS A | PAGE-BASIS MANAGEMENT INFORMATION | |
| | LOGICAL ADDRESS b | PHYSICAL ADDRESS B | PAGE-BASIS MANAGEMENT INFORMATION | |
| | LOGICAL ADDRESS c | PHYSICAL ADDRESS C | PAGE-BASIS MANAGEMENT INFORMATION | |
| | LOGICAL ADDRESS x | PHYSICAL ADDRESS X | PAGE-BASIS MANAGEMENT INFORMATION | |

*FIG. 12A*

FLASH MEMORY INFORMATION MANAGEMENT TABLE

| 1211 | 1212 | 1213 | 1214 | 1215 | 1216 | 1216 | 1210 |
|---|---|---|---|---|---|---|---|
| PHYSICAL ADDRESS A | LOGICAL ADDRESS a | PAGE-BASIS MANAGEMENT INFORMATION | ERASE COUNT | READ DISTURB COUNT | READ COUNT | READ COUNT | |
| PHYSICAL ADDRESS B | LOGICAL ADDRESS b | PAGE-BASIS MANAGEMENT INFORMATION | ERASE COUNT | READ DISTURB COUNT | READ COUNT | READ COUNT | |
| PHYSICAL ADDRESS C | LOGICAL ADDRESS c | PAGE-BASIS MANAGEMENT INFORMATION | ERASE COUNT | READ DISTURB COUNT | READ COUNT | READ COUNT | |
| PHYSICAL ADDRESS X | LOGICAL ADDRESS x | PAGE-BASIS MANAGEMENT INFORMATION | ERASE COUNT | READ DISTURB COUNT | READ COUNT | READ COUNT | |

*FIG. 12B*

APPARATUS FOR DETECTING AND RECOVERING FROM DATA DESTRUCTION CAUSED IN AN UNACCESSED MEMORY CELL BY READ, AND METHOD THEREFOR

CLAIM OF PRIORITY

The present application claims priority from Japanese application JP2007-130379 filed on May 16, 2007, the content of which is hereby incorporated by reference into this application.

BACKGROUND

This invention relates to a storage apparatus that uses a flash memory.

NAND flash memories sometimes suffer from read disturb, which is data destruction caused by read operation. In a NAND flash memory, field effect transistors (FETs) having floating gates are arranged as memory cells in the manner shown in FIG. 1. Several thousand to several ten thousand memory cells are put side by side in a lateral direction, and there are several to several ten memory cells in a longitudinal direction. The memory cells in the same row or column constitute one group, and groups of memory cells constitute a management unit by which data is erased or otherwise managed. Columns of memory cells aligned in the longitudinal direction are obtained by connecting the FETs in series. Electric charges flow into and out of the floating gates through dielectric breakdown or a tunnel effect of an insulating oxide film surrounding the floating gates, which is caused by applying high voltage to source, drain, and gate electrodes.

To read data out of an FET, 0 V is applied to the gate electrode of the chosen FET from which data is to be read whereas Vcc (power supply voltage) is applied to the gate electrodes of the rest of the FETs. Vcc applied to the gate electrodes of the FETs that are not chosen generates a voltage stress in the insulating oxide film, with the result that threshold voltage of the FETs is changed. While Vcc is relatively low voltage compared to write voltage and erase voltage, the application of Vcc generates a large voltage stress in the insulating oxide film at a time of voltage application when the field intensity in a semiconductor is raised by advanced miniaturization of the memory cells.

The threshold voltage of the memory cell FETs that have not been chosen is changed in this manner. When a memory cell FET of which the threshold voltage has thus been changed is chosen in order to read data out of this FET, there is a possibility that wrong data is read.

A technique of preventing such data error is disclosed in JP 2004-326867 A, for example. According to JP 2004-326867 A, data requested by a host is read and an error correction code is used on the read data to detect and correct an error, or judge a degree of error. Before the degree of error reaches a level where correction is not possible, the relevant page is refreshed.

SUMMARY

When a page holding valid data that is not accessed is near a frequently read page, read disturb may destroy the valid data in the page beyond repair of error correction before the data is accessed by the host. In such cases, JP 2004-326867 A has no way of refreshing the page before error correction is no longer possible.

Furthermore, the error correction codes are limited in bit count of data correctable by error correction, and when data is destroyed by more bits than the correctable error bit count, it becomes impossible to restore the data from information stored in the flash memory alone.

According to a representative invention disclosed in this application, there is provided a non-volatile data storage apparatus, comprising: a plurality of memory cells; and a memory controller coupled to the plurality of memory cells, for controlling data write and read in the plurality of memory cells, wherein each of the memory cells includes a field effect transistor having a floating gate, wherein each of the memory cells is included in one of a plurality of management areas, wherein the management areas each include at least two of the memory cells, and wherein the memory controller is configured to: write, in the plurality of memory cells, data and an error correction code calculated from the data; count, for each of the management areas, how many times data read processing has been executed in the memory cells within the management area; read, when the data read processing count that is counted for a first management area, which is one of the plurality of management areas, exceeds a first threshold, the data and the error correction code that are stored in the memory cells within the first management area; decode the read error correction code; and write, when a count of errors included in the read data exceeds a second threshold, the data corrected by decoding the error correction code in other management areas than the first management area.

According to an embodiment of this invention, when the distance is short between first data, which is frequently accessed but only for the reading purpose, and second data, which is neither read nor written, and read disturb destroys the second data, the relevant management unit is checked and the second data is restored by error correction or the like before the destruction of the second data progresses too far. Data reliability is thus ensured.

The embodiment of this invention makes it possible to effectively use the flash memory which otherwise becomes unusable block by block, namely, by erase unit.

BRIEF DESCRIPTION OF THE DRAWINGS

FIG. 12A is an explanatory diagram of a logical address-physical address conversion table managed by an MPU according to the first embodiment of this invention.

FIG. 12B is an explanatory diagram of a flash memory information management table managed by the MPU according to the first embodiment of this invention.

DETAILED DESCRIPTION OF THE PREFERRED EMBODIMENTS

An outline of embodiments of this invention will be given first.

To attain the above object, a controller of a flash memory (flash memory controller) manages a range of memory cells in which data is destroyed by reading as a read disturb management unit (read disturb management area). For each read disturb management unit, the flash memory controller counts how many times read access is made to memory cells contained in the management unit. After the read access count reaches a given count m or higher, each time a given count n is counted up, the flash memory controller reads valid pages within the read disturb management unit. If an error detection circuit detects an error in the read data, an error correction circuit corrects the data and the flash memory controller writes the corrected data in a new page.

Read disturb occurs more often in a block that has a higher erase count and, accordingly, the given count m is controlled in association with the erase count of a unit by which data is erased (i.e., block). Specifically, the given count m is controlled such that m becomes smaller as the erase count rises. A block which is the unit of erase contains one or more read disturb management units.

Whether a block can be used or not is judged based on the read disturb count in addition to the erase count.

In the case where read disturb causes an error that cannot be remedied by error correction within the flash memory controller, the flash memory controller sends address information (e.g., logical block address) of an area that contains the error and other information to a RAID controller. The RAID controller restores the data by RAID technology using a plurality of flash drives, and writes the restored data back to the flash memory.

For that purpose, the flash memory controller is provided with a measure to transmit information such as an interruption signal asynchronously to the RAID controller.

Alternatively, a control device may obtain information about data that is irreparable by the flash memory controller and instruct the RAID controller to restore this data.

Hereinafter, details of the embodiments of this invention will be described.

A first embodiment of this invention will be described first with reference to FIGS. 1, 2, 3, 7, 8, 10, 11, 12A, 12B, 13A, 13B, 14A and 14B.

Figure 1:
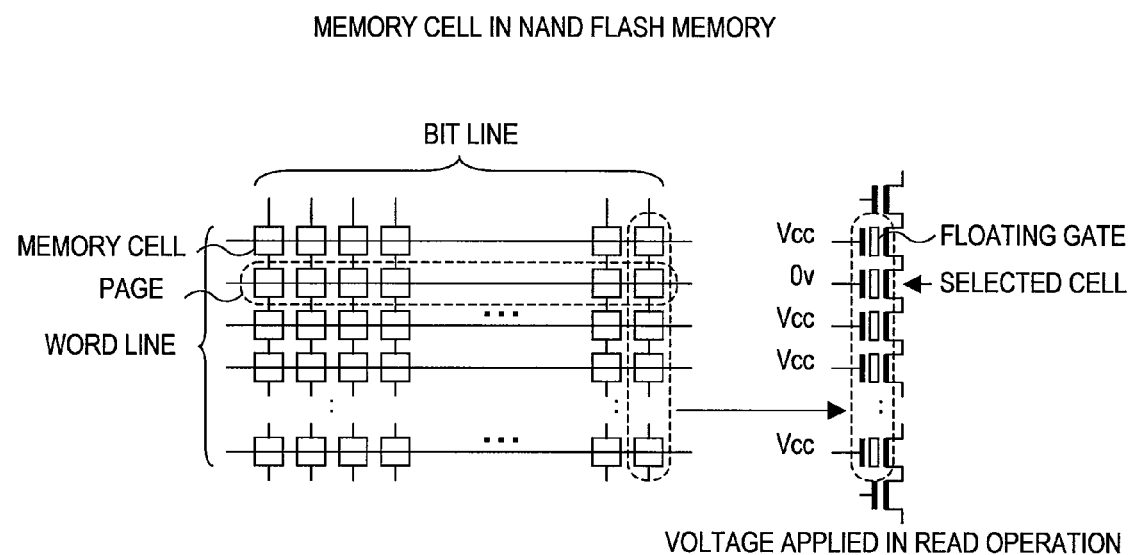
FIG. 1 is an explanatory diagram of memory cells in a NAND flash memory according to a first embodiment of this invention.

FIG. 1 is an explanatory diagram of memory cells in a NAND flash memory according to the first embodiment of this invention.

As shown in FIG. 1, a NAND flash memory has about 16896 memory cells in the lateral direction and about 16 memory cells in the longitudinal direction. Data is often read and written one lateral line of memory cells at a time, which is why each row is treated as a management unit called a page. Memory cells in one vertical line are about 16 FETs having floating gates and connected in series. Read disturb occurs among these serially connected FETs, which means that 16 pages are affected by read disturb. A block by which data is erased is constituted of about 64 pages.

As will be described later with reference to FIG. 2, the influence range of read disturb is managed as a read disturb management area 203. Each read disturb management area 203 is composed of serially connected FETs which individually belong to different pages, and FETs that are contained in each of the pages.

Access to a NAND flash memory is executed by giving a command and an address. The column address is given first and then the row address is given. A row address contains a block address and a page address. Specifically, a block is specified by significant bits of a row address and a page is specified by less significant bits of the row address.

Memory cell arrangement and management unit on a semiconductor chip may differ from one manufacturer to another. Therefore, the above memory cell counts and read disturb influence range are given as an example. This invention is also applicable to semiconductor chips that have different memory cell counts and read disturb influence ranges from those given in the above example.

Figure 8:
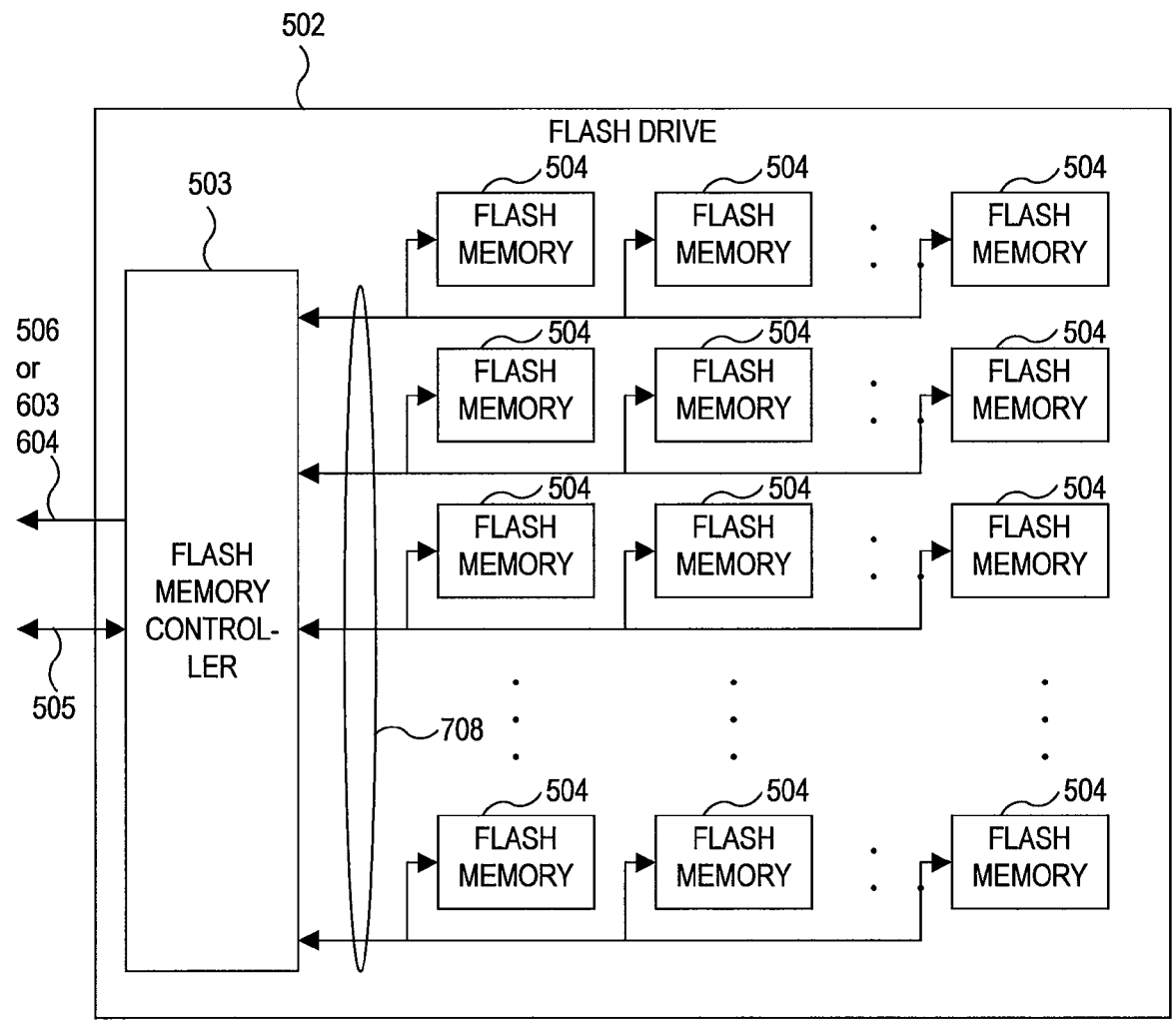
FIG. 8 is a block diagram showing a configuration of a flash drive according to the first embodiment of this invention.

FIG. 8 is a block diagram showing the configuration of a flash drive 502 according to the first embodiment of this invention.

The flash drive 502 is a non-volatile data storage apparatus which employs a NAND flash memory as a data storage element. The flash drive 502 has, for example, as shown in FIG. 8, a flash memory controller 503 and a plurality of flash memories 504, which are connected to the flash memory controller 503. The flash memory controller 503 exchanges information via an information transmission unit 505 with components outside of the flash drive 502. The flash memory controller 503 outputs information about read disturb via an information transmission unit 604 or the like. The flash memory controller 503 and the flash memories 504 are connected to each other through a flash memory interface unit 705 shown in FIG. 7 and connection lines 708.

Figure 7:
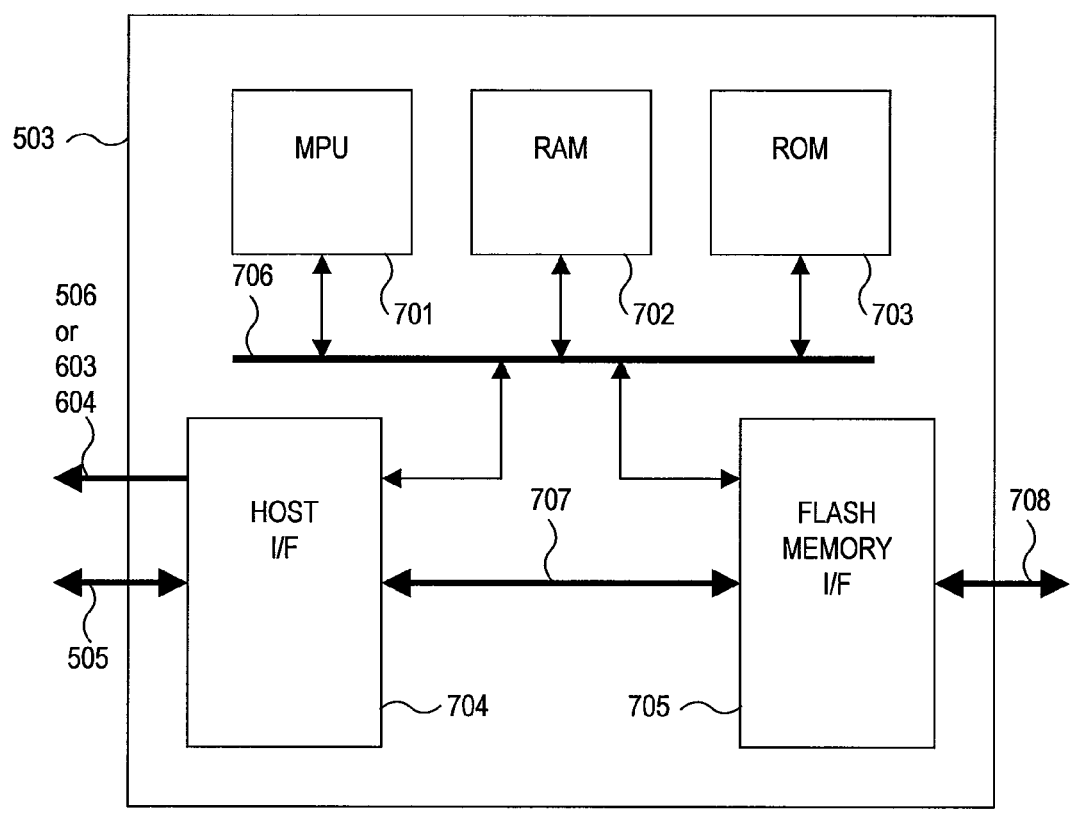
FIG. 7 is a block diagram showing a configuration of a flash memory controller according to the first embodiment of this invention.

FIG. 7 is a block diagram showing the configuration of the flash memory controller 503 according to the first embodiment of this invention.

The flash memory controller 503 has, for example, as shown in FIG. 7, a microprocessor (MPU) 701, a RAM 702, a ROM 703, a host interface unit (HOST I/F) 704, and the flash memory interface unit (Flash Memory IF) 705. The microprocessor 701, the RAM 702, the ROM 703, the host interface unit 704, and the flash memory interface unit 705 are interconnected by a microprocessor bus 706. The host interface unit 704 and the flash memory interface unit 705 are interconnected by a dedicated bus 707, which has a high data transfer rate.

The microprocessor 701 executes a program stored in the ROM 703.

The RAM 702 is a random access memory that serves as the work area of the microprocessor 701 and that stores flash memory management information.

The ROM 703 is a read-only memory that stores a program executed by the microprocessor 701. The ROM 703 stores, for example, a program for controlling and managing the flash memory interface unit 705 or the host interface unit 704, or other components.

The host interface unit 704 is an interface that is connected to an external host (omitted from the drawing) to be used for communications between the external host and the microprocessor 701. An external host is a device that sends a data write request and a data read request to the flash drive 502. Various devices can be connected as external hosts to the host interface unit 704.

For instance, a digital image recorder or a digital audio recorder can serve as an external host. The flash drive 502 in this case is, for example, a memory card used in the recorder.

In the case where the flash drive 502 is used as a data storage device that replaces a hard disk drive (HDD) (shown in FIG. 9), a computer or a RAID controller (will be described later) that sends a data write request and a data read request to the HDD may serve as an external host. The host interface unit 704 in this case communicates with the external host following a protocol such as SCSI or Fibre Channel (FC).

The flash memory interface unit 705 controls a signal that drives a flash memory chip 201, and accesses the flash memory as requested by the microprocessor 701.

Processing described in the following description as one executed by the flash memory controller 503 is, strictly speaking, executed by the MPU 701 which runs a program stored in the RAM 702 or the ROM 703 to control the RAM 702, the ROM 703, the host interface unit 704, and the flash memory interface unit 705.

Figure 2:
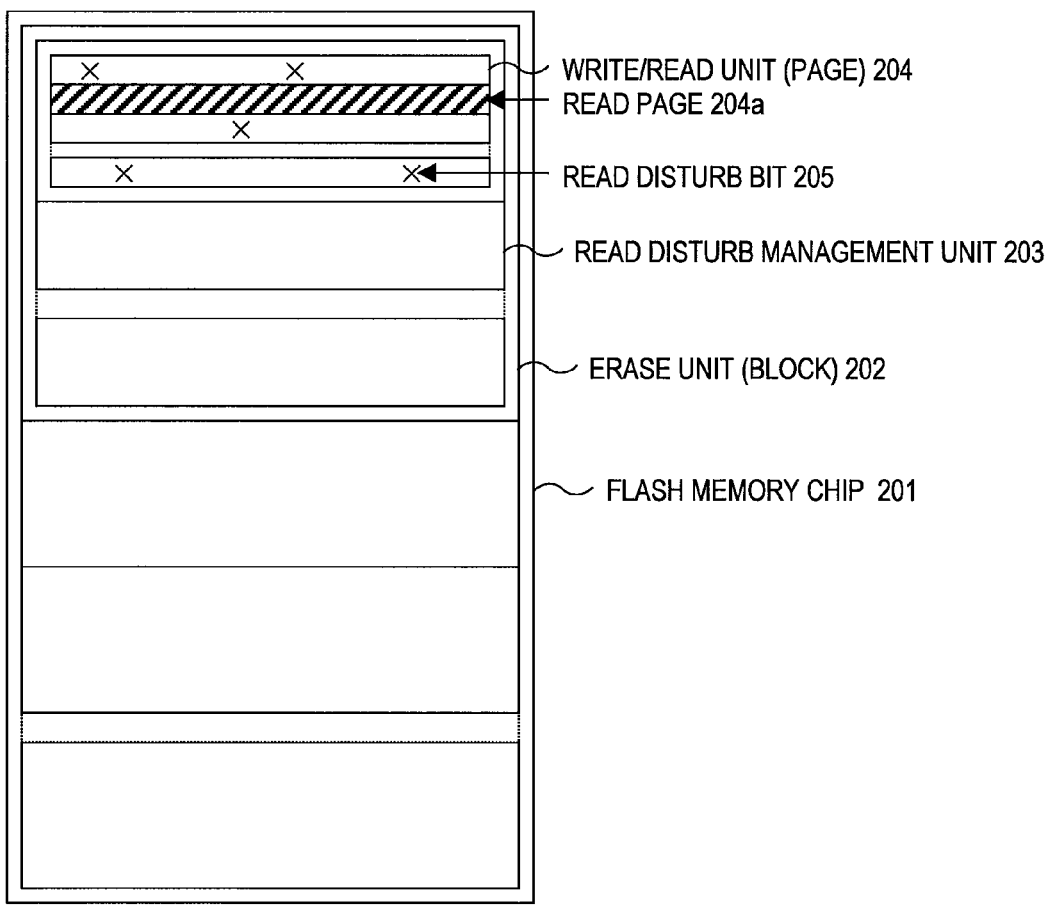
FIG. 2 is an explanatory diagram of a management area in the NAND flash memory according to the first embodiment of this invention.

FIG. 2 is an explanatory diagram of a management area in the NAND flash memory according to the first embodiment of this invention.

The flash memory chip 201 in FIG. 2 corresponds to each flash memory 504 in FIG. 8. As shown in FIG. 2, the storage area of the flash memory chip 201 is divided into a plurality of blocks 202. Each block 202 constitutes a data erase unit. In other words, data written in the flash memory chip 201 is erased one block 202 at a time. Each block 202 is divided into a plurality of read disturb management areas 203. Each read disturb management area 203 is divided into a plurality of pages 204. Each page 204 constitutes a unit by which data is read and written. In other words, data read and data write are executed one page 204 at a time.

When a page 204A which is one of the plurality of pages 204 is read repeatedly, read disturb occurs in other pages 204 within the read disturb management area 203 that contains memory cells constituted of FETs that are serially connected to FETs belonging to the page 204A. The read disturb results in a data alteration (a read disturb bit) 205.

Read disturb is generated by gradual changes in threshold voltage of an FET with a floating gate which are caused by stress from a voltage applied to the gate, the source, and the drain. The rate of change in threshold voltage varies depending on how many times and how long the stress is applied. In other words, the rate of change in threshold voltage varies depending on the erase count, the write count, and the read count.

It is not possible in a flash memory to write new data in a memory cell where data has already been written, unless the old data is erased. Therefore, after data is written in every page 204 within one block 202, no more write operation is performed in the pages 204 within this block 202 until the block 202 is erased of data. This makes the erase count and the read count major stress factors.

Accordingly, the read count of the pages 204 in each read disturb management area 203 is managed by adding read disturb management area-basis management information 303 to page-basis management information 301 and block-basis management information 302. It should be noted that page-basis management information 301 and block-basis management information 302 have also been managed in conventional flash memories.

Figure 3:
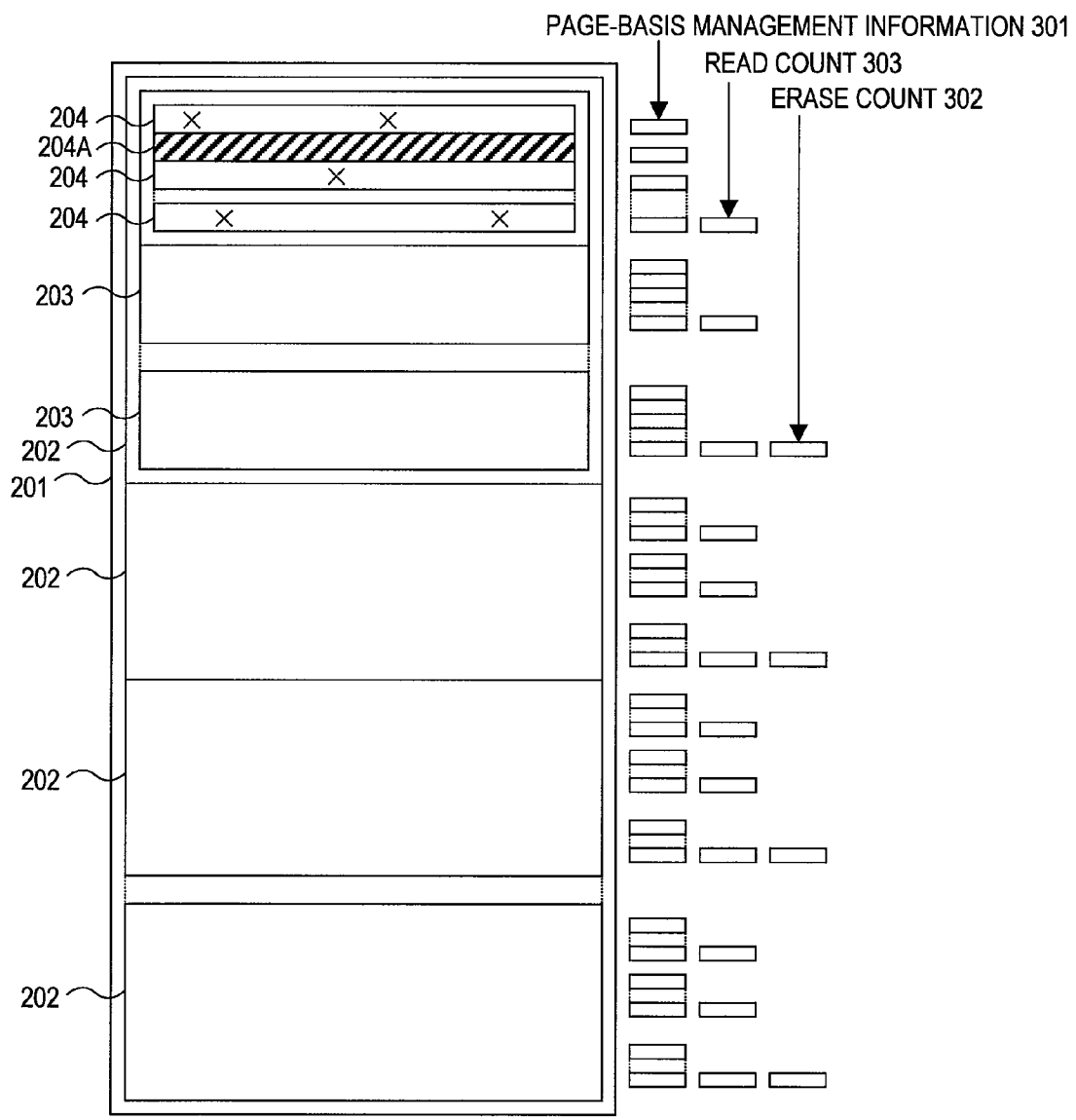
FIG. 3 is an explanatory diagram of management information specific to each management area according to the first embodiment of this invention.

FIG. 3 is an explanatory diagram of management information specific to each management area according to the first embodiment of this invention.

The page-basis management information 301 contains logical address information and error correction information of each page. The error correction information contains an error correction code (ECC) created from values held by memory cells that belong to the page. The block-basis management information 302 contains the erase count of each block. The page-basis management information and the block-basis management information are conventional management information.

The read disturb management area-basis management information 303, which is a new addition by this embodiment, contains the read count of the pages 204 in each read disturb management area 203.

When the read count exceeds a given threshold, the flash memory controller 503 runs a read disturb check. The read disturb check is processing in which the flash memory controller 503 sequentially reads all pages 204 within the read disturb management area 203 and performs error detection with the use of an error correction code set for each page 204 or for each sector (not shown in the drawing) that constitutes the page 204, to thereby judge whether or not read disturb has occurred.

Being processing that involves checking the pages 204 within one read disturb management area 203 in order, the read disturb check takes some time, and a request to access the flash memory chip 201 may arrive during the read disturb check from an external host such as the RAID controller (which will be described later). In such cases, the flash memory controller 503 processes the access request from the external host first since it is necessary to respond to external hosts quickly.

The flash memory controller 503 conducting the read disturb check judges whether to refresh all pages 204 within the read disturb management area 203 based on the error bit count of each page 204 or of each sector and the count of pages in which errors are detected. To give a specific example, when the count of the pages 204 in one read disturb management area 203 that contain more error bits than a given threshold exceeds another given threshold, the flash memory controller 503 may judge that all pages 204 in this read disturb management area 203 should be refreshed. The term refresh refers to reading all pages 204 in one read disturb management area 203, correcting error bits if there are any, and copying the read (or corrected) page 204 to another read disturb management area 203 from which data has been erased in advance.

After executing refreshing, the flash memory controller 503 clears the management information 303 (i.e., read count) specific to the read disturb management area 203 with zero, and manages the read count of the pages 204 in the read disturb management area 203 anew.

In the case where there is a competition between the refresh operation and an access request from an external host such as the RAID controller, the flash memory controller 503 processes the refresh operation first.

The likeliness of read disturb happening depends not only on the read count but also on the erase count. Pages in the block 202 that has undergone erase operation more times require a smaller read count to cause read disturb. Therefore, the read count threshold for determining whether to run a read disturb check may be set in a manner that makes the threshold smaller as the erase count rises.

For example, when the maximum erase count set to the flash memory element itself is n times, a read disturb check is run each time the read count reaches ten billion in the read disturb management area 203 within the block 202 that has an erase count of smaller than 0.5·n as shown in Table 1 (see a read count a in Table 1). Shown in Table 1 is an example in which n represents 100000 times. Similarly, a read disturb check is run each time the read count reaches a hundred million in the read disturb management area 203 within the block 202 that has an erase count of equal to or larger than 0.5·n and smaller than 0.8·n. In the read disturb management area 203 within the block 202 that has an erase count of equal to or larger than 0.8·n and smaller than 0.9·n, a read disturb check is run each time the read count reaches a million. In the read disturb management area 203 within the block 202 that has an erase count of equal to or larger than 0.9·n and equal to or smaller than n, a read disturb check is run each time the read count reaches ten thousand. The block 202 that has been erased of data n times is no longer allowed to be used. By varying the threshold for executing the read disturb check depending on the erase count in this manner, errors from read disturb are prevented from increasing in number beyond the correctable error bit count and, to begin with, the frequency of the read disturb check can be reduced as much as possible.

In the read disturb management area 203 where the read count has exceeded the threshold a, a read disturb check may be run each time the read count subsequently reaches b (a>b) (see a read count b in Table 1).

For example, in the read disturb management area 203 within the block 202 that has an erase count of smaller than 0.5·n (50000 times), a read disturb check is run at the time the read count reaches ten billion (see the read count a in Table 1) and, thereafter, a read disturb check may be conducted each time reading is executed a billion times (see the read count b in Table 1). In the read disturb management area 203 within the block 202 where the erase count has reached 100000, a read disturb check is run at the time 10000 is counted as the read count and, thereafter, a read disturb check may be conducted each time reading is executed 1000 times.

The read count threshold that is used to determine whether to execute the read disturb check when the erase count exceeds a given threshold (e.g., 0.5·n) is thus smaller than the read count threshold that is used when the erase count is smaller than the given threshold. Furthermore, the read count threshold (e.g., a billion) that is used to determine whether to execute the read disturb check after the read count exceeds a given threshold (e.g., ten billion) is smaller than the read count threshold (e.g., ten billion) that is used to determine whether to execute the read disturb check before the read count exceeds the given threshold (e.g., ten billion).

Information showing these relations between the erase count and the read disturb check threshold (Table 1) is stored in the ROM 703.

TABLE 1

RELATION BETWEEN ERASE COUNT AND READ DISTURB CHECK THRESHOLD (n = 100,000)

| | Read Disturb Check Threshold | | | |
|---|---|---|---|---|
| | Less than 50,000 times | 50,000 to less than 80,000 times | 80,000 to less than 90,000 times | 90,000 to less than 100,000 times |
| Read Count a | 10 billion times | 100,000,000 times | 1,000,000 times | 10,000 times |
| Read Count b | 1 billion times | 10,000,000 times | 100,000 times | 1,000 times |

The read disturb management area 203 in which read disturb is detected has to be refreshed (i.e., copied). As an area to which this read disturb management area 203 is to be copied, the flash memory controller 503 preferentially chooses the read disturb management area 203 that has a small erase count and is less prone to read disturb. Detection of read disturbance in one read disturb management area 203 indicates that, in this area, the proportion of read to write is extremely large with almost no write operation conducted. Therefore, unlike refreshing for leveling the erase count, the read disturb management area 203 that has a small erase count and is not suffering read disturb is preferentially chosen as an area where the read disturb management area 203 suffering read disturb is refreshed.

Data managed on a read disturb management unit (i.e., read disturb management area 203) basis or on an erase unit (i.e., block 202) basis may be stored in a non-volatile memory which keeps data after power supply to the flash drive 502 stops. Alternatively, after power supply to the flash drive 502 stops, a battery or the like may provide power sufficient to keep the flash drive 502 running while writing minimum information of the managed data in a dedicated area inside the flash memory.

Figure 10:
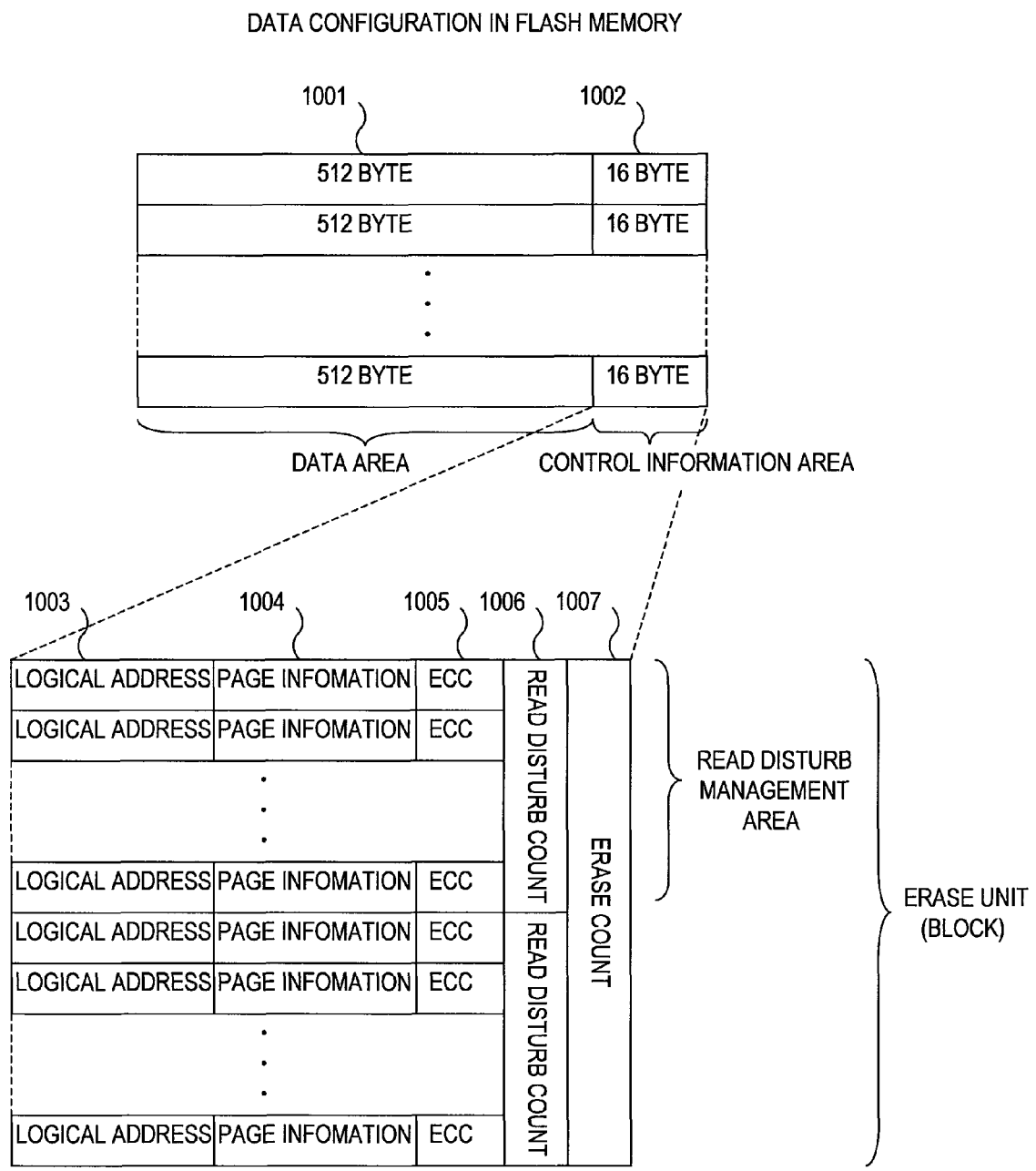
FIG. 10 is an explanatory diagram of a data configuration in the flash memory according to the first embodiment of this invention.

FIG. 10 is an explanatory diagram of a data configuration in the flash memory according to the first embodiment of this invention.

The actual flash memory chip 201 has, for example, as shown in FIG. 10, 16 bytes of control information area 1002 for every data area 1001, which has a size of 512 bytes. Stored in this control information area 1002 along with data are a logical address 1003 unique to each page 204, page-basis information 1004, and an error correction code (ECC) 1005. The page-basis information 1004 contains information indicating whether the page 204 is valid or invalid, and information indicating an address within the block 202 that is assigned to the page 204. The error correction code 1005 is calculated from data stored in the data area 1001. The flash memory controller 503 judges the error bit count in the data area 1001 by decoding the error correction code 1005.

The control information area 1002 also stores, for each read disturb management area 203, a read disturb count 1006 and, for each block 202, an erase count 1007. Information stored for each group consisting of a plurality of pages 204, such as the read disturb count 1006 and the erase count 1007, may be stored in an area that is an aggregation of the 16-byte management area portions for the respective pages 204.

The logical address 1003, the page-basis information 1004, and the error correction code (ECC) 1005 correspond to the page-basis management information 301 of FIG. 3. The erase count 1007 corresponds to the erase count 302 of FIG. 3. The read disturb count 1006 corresponds to a read disturb count 401 of FIG. 4, which will be described later in a second embodiment.

Figure 11:
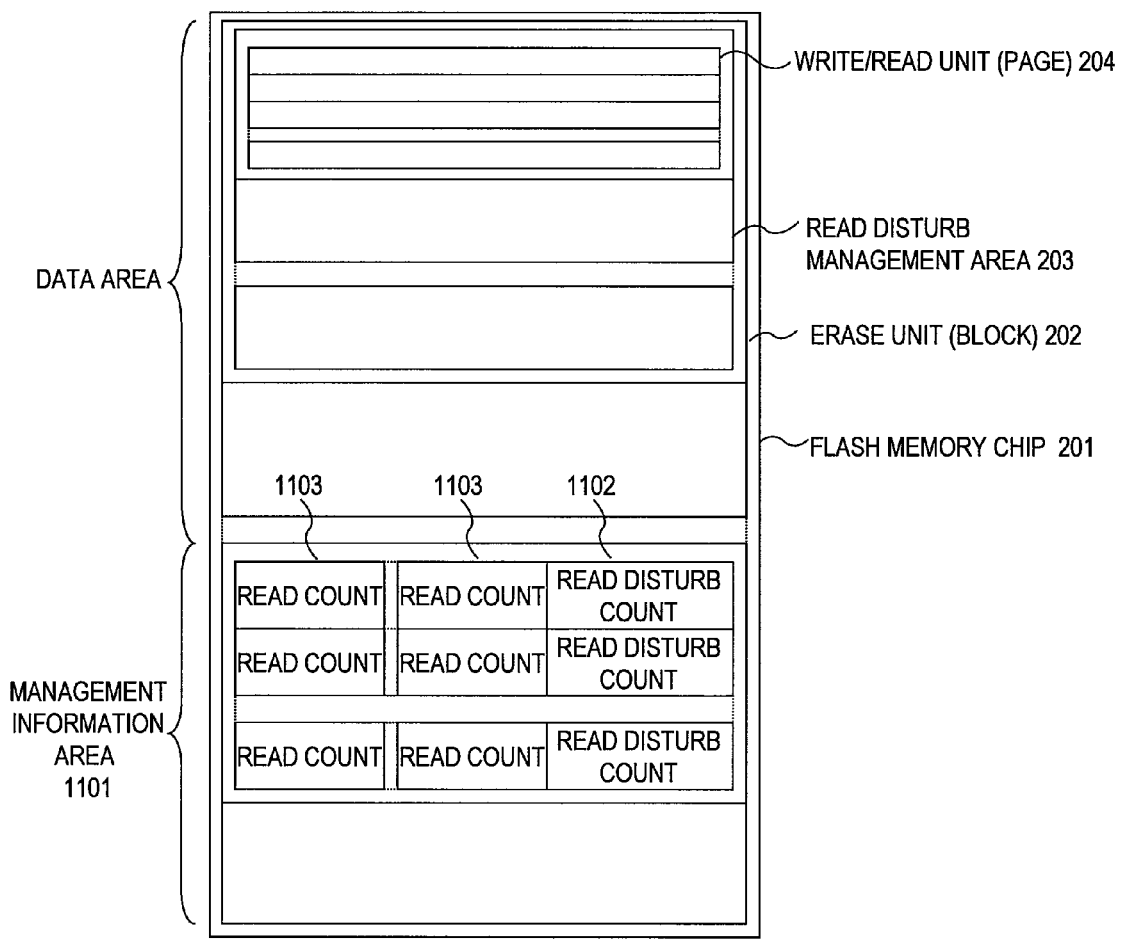
FIG. 11 is another explanatory diagram of a data configuration in the flash memory according to the first embodiment of this invention.

FIG. 11 is another explanatory diagram of a data configuration in the flash memory according to the first embodiment of this invention.

The read count of each read disturb management area 203 and the read disturb count are held in the RAM 702 in principle. However, since a common RAM cannot keep data after the power is cut off, a battery, a large-capacity capacitor, or the like may be provided inside or outside of the flash drive 502. For instance, as shown in FIG. 11, a management information area 1101 is provided in a part of the storage area of the flash memory chip 201. Upon detecting that the power has been cut off, the flash memory controller 503 uses power supplied from the battery or the like to store the read count 1103 of each read disturb management area 203 and the read disturb count 1102 of each block 202 in the management information area 1101. Alternatively, a non-volatile RAM may be employed for the RAM 702 in the first place.

The above-described processing after the power is cut off is executed promptly by using interruption processing of the MPU 701 or the like. The management information area 1101 may be placed in one flash memory chip 201, or may be placed in a plurality of flash memory chips 201 in a dispersed manner.

Information managed by the MPU 701 includes, for example, as shown in FIGS. 12A and 12B, a logical address-physical address conversion table 1200 and a flash memory information management table 1210. These tables are stored in the RAM 702.

FIG. 12A is an explanatory diagram of the logical address-physical address conversion table 1200 managed by the MPU 701 according to the first embodiment of this invention.

The logical address-physical address conversion table 1200 is used to convert a logical address 1201, which is presented by an external host outside of the flash drive 502, into a physical address 1202, which indicates the flash memory chip 201 that stores data associated with the logical address 1201 and the location in the flash memory chip 201 of the stored data.

The logical address 1201 and the physical address 1202 are addresses assigned to each block 202, meaning that the addresses are managed on a block basis. The address of each page 204 in the block 202 may be managed as page-basis management information 1203 along with information that indicates the page validity/invalidity and other information.

FIG. 12B is an explanatory diagram of the flash memory information management table 1210 managed by the MPU 701 according to the first embodiment of this invention.

The flash memory information management table 1210 holds, for each flash memory management unit, a logical address 1212, page-basis management information 1213, an erase count 1214, a read disturb count 1215, a read count 1216, and the like in association with a physical address 1211.

The physical address 1211, the logical address 1212, and the page-basis management information 1213 are the same as the physical address 1202, the logical address 1201, and the page-basis management information 1203 in FIG. 12A, respectively. This means that the physical address 1211 and the logical address 1212 are addresses assigned to each block 202 which is the erase unit.

The erase count 1214 indicates how many times erase processing has been executed in the block 202 that is identified by the physical address 1211. The erase count 1214 corresponds to the erase count 302 in FIG. 3. The erase count 1214 is not cleared with zero, and therefore a cumulative count is registered as the erase count 1214.

The read disturb count 1215 indicates how many times read disturb has occurred in the block 202 that is identified by the physical address 1211. The read disturb count 1215 is not cleared with zero, and therefore a cumulative count is registered as the read disturb count 1215. The flash memory information management table 1210 in the first embodiment may not contain the read disturb count 1215. Processing based on the read disturb count 1215 will be described in the second embodiment of this invention.

A plurality of read counts 1216 that are associated with one physical address 1211 indicate how many times read processing has been executed in a plurality of read disturb management areas 203 contained in the block 202 that is identified by the physical address 1211. The read count 1216 corresponds to the read count 303 of FIG. 3. The read count 1216 is cleared with zero when every piece of data in one read disturb management area 203 finishes being copied through refresh processing.

The logical address-physical address conversion table 1200 and the flash memory information management table 1210, which are stored in the RAM 702, lose their data when the power is cut off. The MPU 701 therefore reads the control information area 1002 and the management information area 1101 in the flash memory 504 when the power is turned on to construct the logical address-physical address conversion table 1200 and the flash memory information management table 1210, and stores the constructed tables in the RAM 702.

The flow of processing executed by the flash memory controller 503 will be described next with reference to FIG. 13A, FIG. 13B, FIG. 14A and FIG. 14B.

Figure 13A:
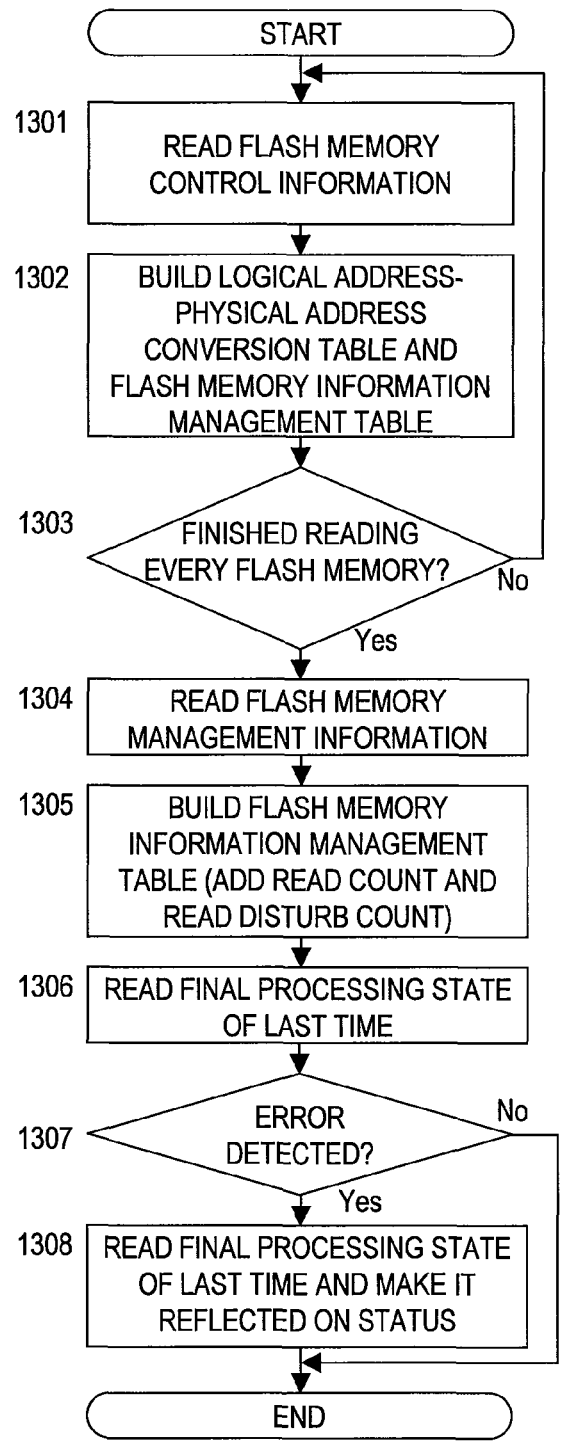
FIG. 13A is a flow chart for processing that is executed by the flash memory controller when the flash drive is powered on according to the first embodiment of this invention.

FIG. 13A is a flow chart for processing that is executed by the flash memory controller 503 when the flash drive 502 is powered on according to the first embodiment of this invention.

First, the flash memory controller 503 reads the control information area 1002 of one flash memory chip (Step 1301).

Next, the flash memory controller 503 reads a logical address assigned to each block 202 which is the erase unit of each physical flash memory, and reads the logical address of each page 204 in the block 202. Based on the read addresses, the flash memory controller 503 constructs the logical address-physical address conversion table 1200 and the columns 1211 to 1213 of the flash memory information management table 1210 (Step 1302). The columns 1211 to 1213 hold the same information that is held in the logical address-physical address conversion table 1200. Steps 1301 and 1302 are repeated until the control information of every flash memory is read (Step 1303).

The flash memory controller 503 then refers to the management information area 1101 allocated to some flash memories to read the read count 1103 of each read disturb management unit and the read disturb count 1102 (Step 1304), and adds the read values as the read count 1216 and the read disturb count 1215 to the flash memory information management table 1210 (Step 1305).

Next, the flash memory controller 503 reads the final processing state of the last time (Step 1306) and judges whether or not there is an error (Step 1307). When it is judged in Step 1307 that there is an error, the flash memory controller 503 makes a status reflect the read final processing state of the last time (Step 1308), and ends the processing. When it is judged in Step 1307 that no error has occurred, the flash memory controller 503 ends the processing without executing Step 1308.

After the above series of processing is finished, the flash memory controller 503 waits for a command sent from an external host via the information transmission unit 505 and processes the command, and repeats this waiting and processing operation.

Figure 13B:
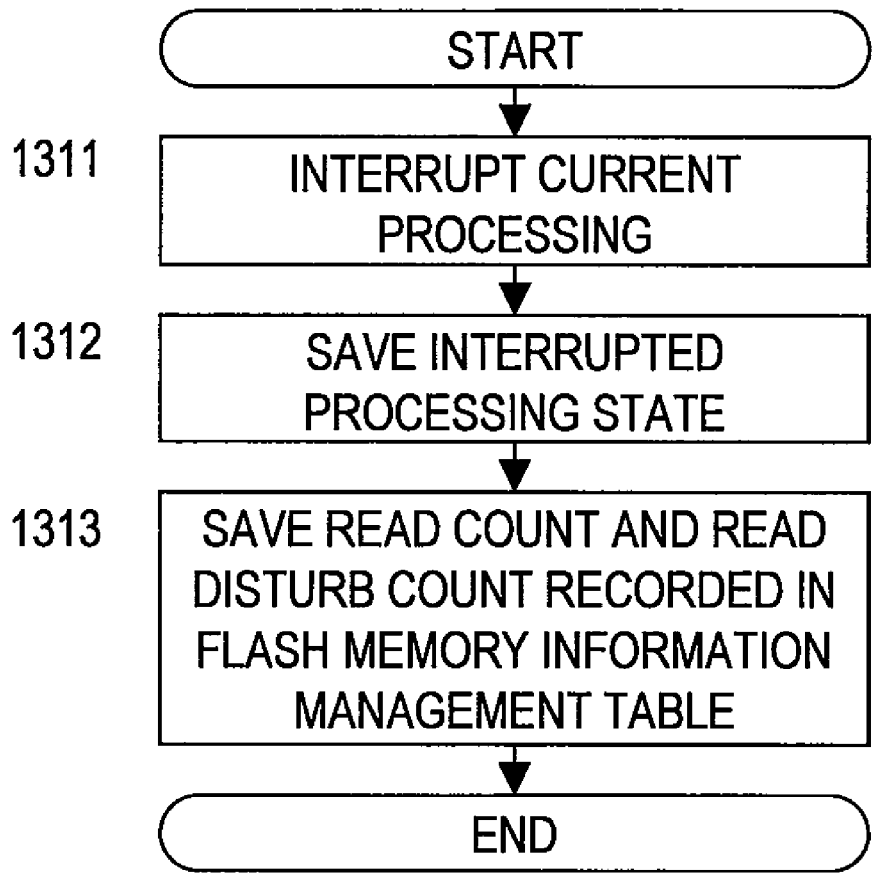
FIG. 13B is a flow chart for processing that is executed by the flash memory controller when the flash drive is powered off according to the first embodiment of this invention.

FIG. 13B is a flow chart for processing that is executed by the flash memory controller 503 when the flash drive 502 is powered off according to the first embodiment of this invention.

After the flash drive 502 is powered on, only data read may be executed whereas data is not written in the flash memories 504 even once before the flash drive 502 is powered off. In this case, the read count 1216 is updated, but the updated read count 1216 is lost when the flash drive 502 is powered off since the flash memory information management table 1210 is stored in a volatile memory (namely, the RAM 702). The flash memory controller 503 therefore stops processing that is being executed at the time the cutoff of power supplied from the outside of the flash drive 502 is detected (Step 1311). The flash memory controller 503 saves the interrupted processing state (Step 1312).

The flash memory controller 503 next writes the read count 1216 and read disturb count 1215 in the management information area 1101 of the non-volatile flash memories 504 (Step 1313). During the period after the external power supply is cut off until writing of the read count 1216 in the management information area 1101 is completed, power is supplied from a battery (not shown in the drawing), a large-capacity capacitor (not shown in the drawing), or the like that is provided in the flash drive 502.

Write and read processing executed by the flash memory controller 503 will be described next.

The flash memory controller 503 receives a write command and data to be written from an external host, and calculates an error correction code from the data to be written. The flash memory controller 503 then stores the data to be written and the error correction code in the data area 1001 and the control information area 1002 (more specifically, the error correction code 1005) at an address specified by the write command. This processing is the same as the one in prior art, and a detailed description thereof will be omitted.

Figure 14A:
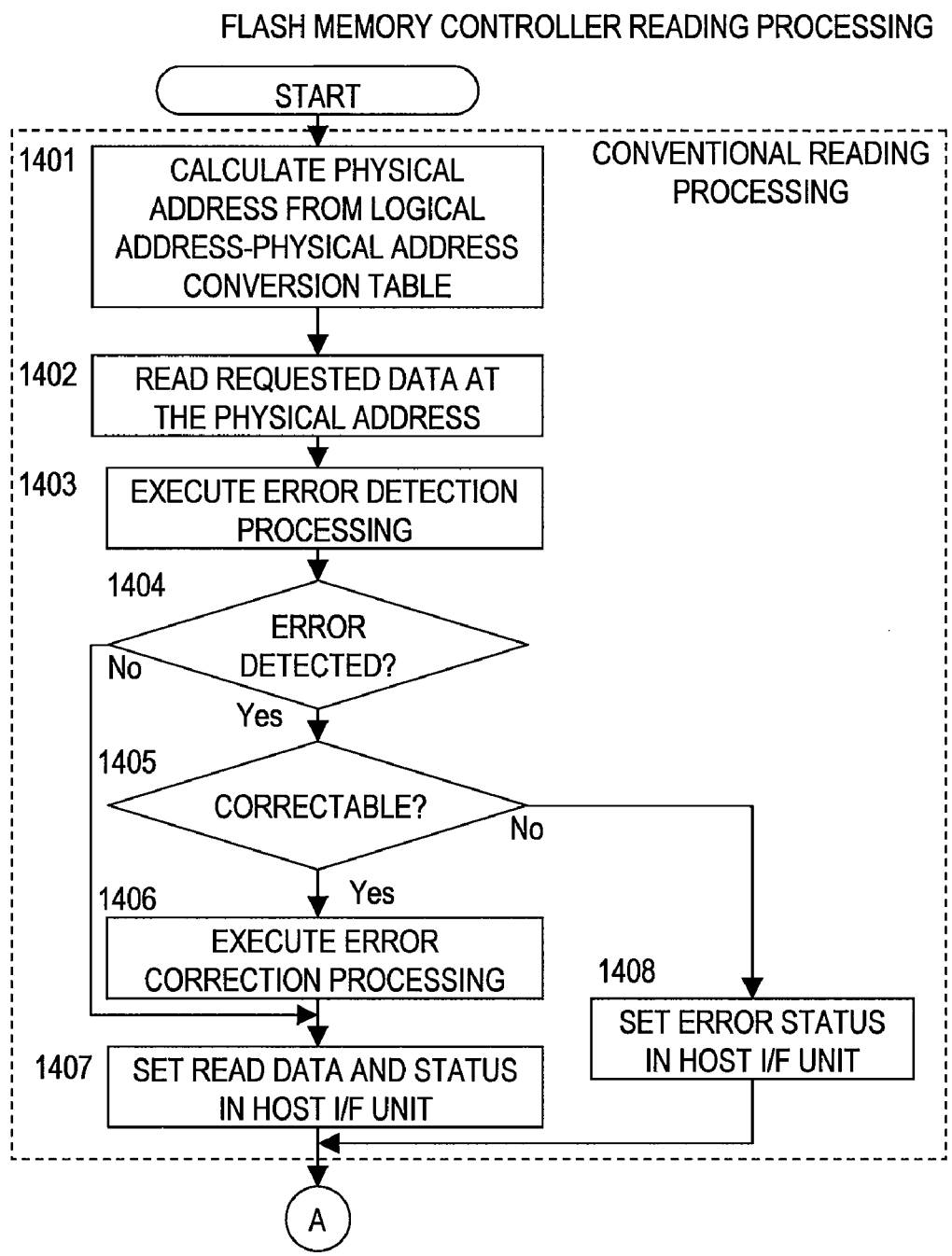
FIGS. 14A and 14B are flow charts for read processing that is executed by the flash memory controller according to the first embodiment of this invention.
Figure 14B:
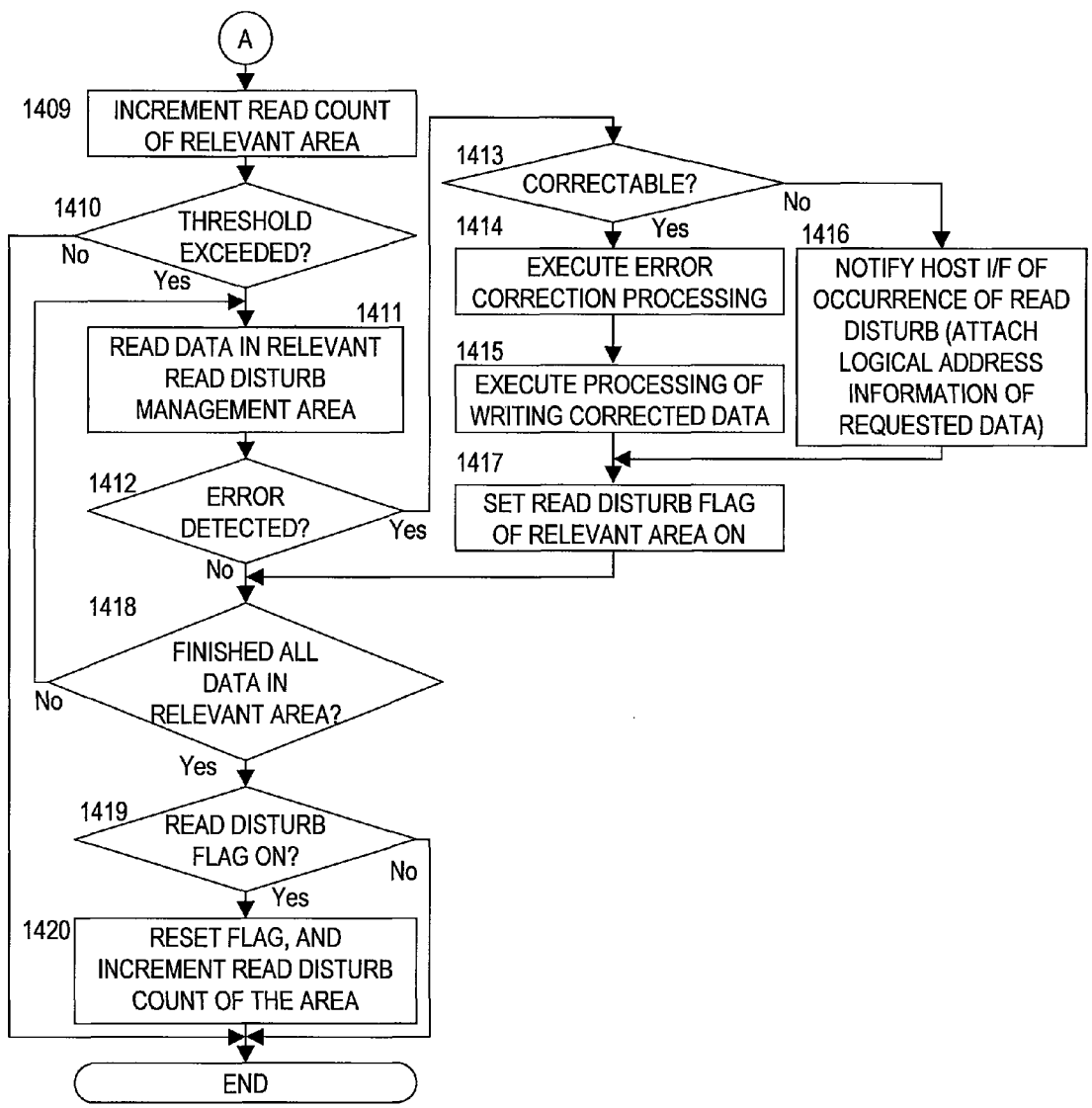

FIGS. 14A and 14B are flow charts for read processing that is executed by the flash memory controller 503 according to the first embodiment of this invention.

Shown in FIGS. 14A and 14B is processing that includes performing error correction processing on data of the pages 204 where correctable errors are detected by sequentially reading data of the pages 204 through a read disturb check, and writing the corrected data in the flash memory in the same manner as the normal write processing.

The flash memory controller 503 receives a read command and the logical address of data to be read from an external host, and uses the flash memory information management table 1210 and the logical address-physical address conversion table 1200 to calculate which block 202 in which flash memory chip 201 contains the data to be read (Step 1401).

Next, the flash memory controller 503 reads the requested data and flash memory control information that is associated with the requested data out of the flash memory chip 201 in which the calculated physical address is located (Step 1402). The data to be read here is data stored in the data area 1001 that is identified by the calculated physical address. The flash memory control information associated with the data to be read is information stored in the control information area 1002 that is associated with the identified data area 1001.

The flash memory controller 503 next checks whether or not an error is found in the read data (Step 1403). This check is executed by, for example, decoding the error correction code 1005.

When an error is found in the read data (Step 1404) and the error is correctable by decoding the error correction code 1005 (Step 1405), the flash memory controller 503 corrects the error (Step 1406) and sends the read and corrected data to the external host via the host interface unit 704 (Step 1407). When the read data contains an error that cannot be corrected by decoding the error correction code 1005 (Step 1405), on the other hand, the flash memory controller 503 reports that the requested data is defective as a status to the external host via the host interface unit 704 (Step 1408). The above processing from Step 1401 to Step 1408 is no different from the technique employed in conventional flash drives.

After the reading processing instructed by the external host is completed (i.e., after Step 1407 or Step 1408 is finished), the flash memory controller 503 increments the read count 303 of the relevant read disturb management area 203 (i.e., the read disturb management area 203 that contains the data requested to be read) by 1 (Step 1409).

When the read count 303 exceeds the threshold (Step 1410), the flash memory controller 503 reads data (i.e., data in the data area 1001 and the control information area 1002) in the read disturb management area 203 whose read count 303 has exceeded the threshold (Step 1411). The flash memory controller 503 decodes the read error correction code 1005, to thereby judge whether there is an error or not (Step 1412).

The threshold used in Step 1410 is the read count a or the read count b that has been described with reference to Table 1.

Instead of judging whether or not there is an error, the flash memory controller 503 may judge in Step 1412 whether or not the count of detected errors (for example, the bit error count or the count of pages 204 that contain a given count of bit errors or more) exceeds a given threshold.

When the flash memory controller 503 judges in Step 1412 that there is an error, it is interpreted as a sign of read disturb. Then the flash memory controller 503 judges whether or not the error is correctable by decoding the error correction code (Step 1413). When the error is correctable, the flash memory controller 503 corrects the error (Step 1414), and writes the read and corrected data in a new, cleared page 204 in other read disturb management areas 203 than the one that has originally contained the corrected data (Step 1415). This processing may be executed by the same write method that is employed in prior art.

When it is judged in Step 1413 that the error is not correctable, the flash memory controller 503 saves the logical address of the page 204 that holds the requested data in order to report the fact to the external host. The flash memory controller 503 then sends a notification informing that the requested data contains an uncorrectable error to the external host through the host interface unit 704 (Step 1416). This notification may contain the logical address of the page 204 that holds the requested data with an uncorrectable error.

After Step 1415 or Step 1416 is finished, the flash memory controller 503 sets a read disturb flag (omitted from the drawings) of the area containing the requested data (Step 1417).

When Step 1417 is executed, or when it is judged in Step 1412 that there is no error, the flash memory controller 503 judges whether or not every piece of data in the relevant read disturb management area 203 has received the processing of Steps 1411 to 1417 (Step 1418).

In the case where there are still some data that have not received the processing of Steps 1411 to 1417, the read disturb management area 203 performs the processing of Step 1411 and the subsequent steps on the remaining data.

When the processing of Steps 1411 to 1417 is finished for all of the data, the flash memory controller 503 judges whether or not the read disturb flag of the read disturb management area 203 that contains the requested data is set (Step 1419).

When it is judged in Step 1419 that the read disturb flag of the read disturb management area 203 that contains the requested data is set, it means that the read disturb management area 203 is suffering read disturb. Then the flash memory controller 503 resets the read disturb flag, increments the read disturb count 1215 (Step 1420), and ends the processing.

On the other hand, when it is judged in Step 1419 that the read disturb flag is not set, it means that the read disturb management area 203 that contains the requested data is not suffering read disturb. Then the flash memory controller 503 ends the processing without executing Step 1420.

The processing of sending the notification to the external host in Step 1416 may be executed after it is judged in Step 1418 that every piece of data has been processed.

In the case where every piece of data in the relevant read disturb management area 203 is read in Step 1411 to receive the judging processing of Step 1412 and Step 1413, and it is judged in Step 1413 that the error is correctable, the entirety of the relevant read disturb management area 203 may be copied to a new area.

As described above, according to the first embodiment of this invention, error detection is executed by reading every piece of data in a read disturb management area when the executed read count exceeds a given threshold. This makes it possible to detect a read disturb-induced error in the page 204 that has never received a read request from an external host. A read count counted before a read disturb check has to be run is determined depending on the erase count. Therefore, an error caused by read disturb can be detected reliably irrespective of whether there are conditions favorable for read disturb (i.e., a high erase count).

The second embodiment of this invention will be described next with reference to FIG. 4.

The following description addresses differences between the first embodiment and the second embodiment while omitting description common to the first and second embodiments.

Figure 4:
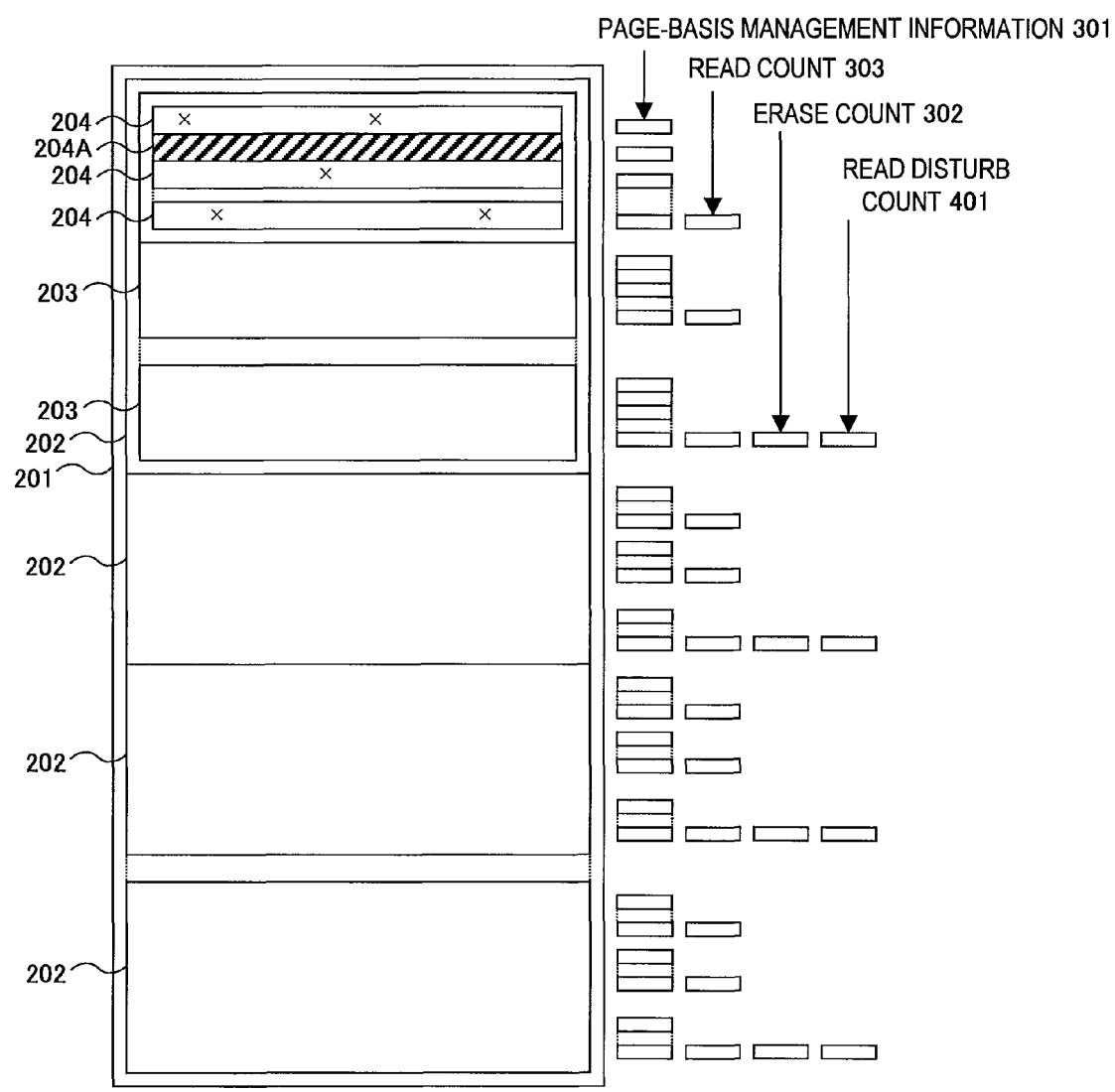
FIG. 4 is an explanatory diagram of management information specific to each management area according to a second embodiment of this invention.

FIG. 4 is an explanatory diagram of management information specific to each management area according to the second embodiment of this invention.

The erase count 302 of each block 202 (erase unit) is often managed through flash memory control in prior art. In the second embodiment, the read disturb count 401 of each block 202 is managed in addition to the erase count 302. The read disturb count 401 is incremented when it is judged that read disturb has occurred in the single read disturb management area 203, or one of a plurality of read disturb management areas 203, contained in the block 202. Whether or not read disturb has occurred may be judged by, for example, the method employed in Step 1412 of FIG. 14B.

The threshold of an FET having a floating gate and the insulating strength and other physical properties of an insulating oxide film are varied depending on the read access count as well as the erase count 302. Accordingly, in some cases, the block 202 has to be judged as unusable based on the read access count while the erase count 302 is lower than a threshold for judging whether the block 202 is usable.

The flash memory controller 503 in the second embodiment comprehensively judges the usability of the block by basing its judgment on a threshold that is set taking into account the read disturb count 401 and the erase count 302, in addition to managing the read disturb count 401.

For example, n times counted as the read disturb count 401 may be deemed equivalent to one time counted as the erase count 302, or one time counted as the read disturb count 401 may be deemed equivalent to n times counted as the erase count 302 (n is an arbitrary natural number).

This makes the read count threshold that is used in determining whether to execute the read disturb check when the read disturb count 401 exceeds a given threshold smaller than the read count threshold that is used when the read disturb count 401 is lower than the given threshold (see Table 1).

As described above, according to the second embodiment of this invention, a read count counted before a read disturb check has to be run is determined depending on the past read disturb count. Therefore, an error caused by read disturb can be detected reliably irrespective of whether there are conditions favorable for read disturb (i.e., a high past read disturb count).

A third embodiment of this invention will be described next with reference to FIG. 5, FIG. 9, and FIG. 15.

The above descriptions of the first embodiment and the second embodiment apply to the third embodiment if the word "external host" is replaced with "RAID controller 501".

Flash memories discussed in this invention cannot ensure the accuracy of the erase count, nor can guarantee that read disturb will not happen. This is because, when a flash memory is repeatedly read in order to confirm the erase count, the flash memory is degraded by this very act of accessing for confirmation. The same can be said with regard to read disturb. Also, while checking one block 202 in one flash memory chip 201 can give some indication of what performance other blocks 202 in this flash memory chip 201 have, there is no guarantee that they have exactly the same performance.

In the worst case, a read disturb check may reveal data destruction that is already past the point at which repair can be provided by error correction within the flash memory controller 503 due to fluctuations throughout the semiconductor wafer and fluctuations among the blocks 202 within each flash memory chip 201.

Data destruction to such a degree is not found out unless data is read on a read unit basis which contains the destroyed data, or on a error correction unit basis which is smaller than the read unit, and the presence or absence of an error is checked with the use of an attached error correction code.

This is why sometimes it is not until a read disturb check is run that destruction of unaccessed data is detected, and the error is not correctable by an attached error correction code.

Since such data cannot be restored merely by the function of the flash drive 502, a RAID (Redundant Arrays of Inexpensive Disks) system or the like is built to deal with the error.

Figure 9:
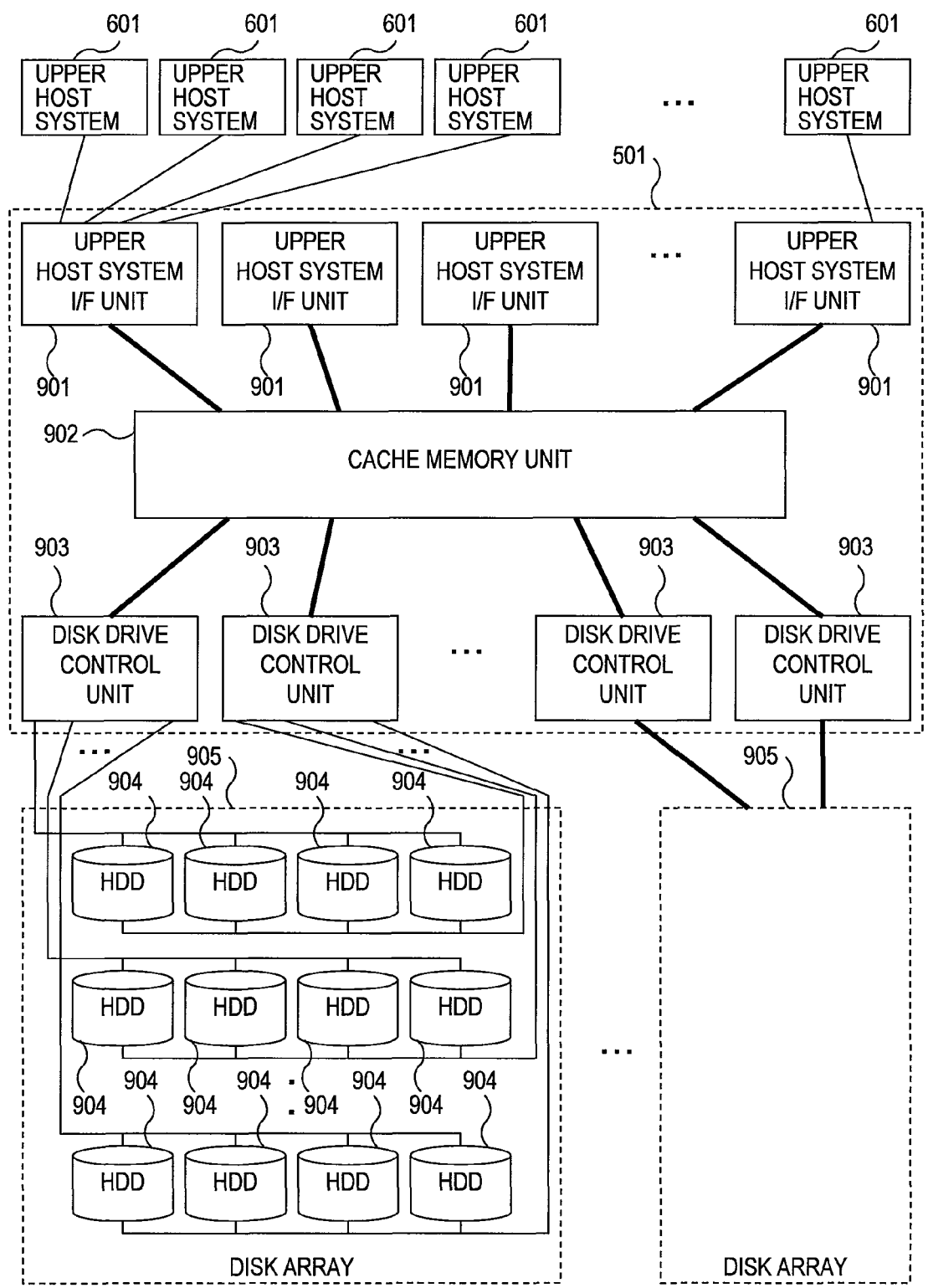
FIG. 9 is a block diagram showing the configuration of a RAID system to which the third embodiment of this invention is applied.

FIG. 9 is a block diagram showing the configuration of a RAID system to which the third embodiment of this invention is applied.

The RAID system is a storage system having disk arrays 905 which are provided redundancy by many hard disk drives (HDDs) 904.

The RAID system provides an external storage space to, for example, a plurality of upper host systems 601 as shown in FIG. 9. The RAID controller 501 controls and manages many HDDs 904 as one disk array 905. For instance, the RAID controller 501 constructs a parity group from about four HDDs 904, creates one sector of parity data for three sectors of data, and distributes the four sectors of data in total among the four HDDs 904. This way, if one sector of data out of the four sectors is destroyed, the destroyed one sector of data can be restored from the remaining three sectors of data.

Alternatively, the RAID controller 501 may construct a parity group from two HDDs 904 to store the same data in these two HDDs 904. If data in one of the two HDDs 904 is destroyed, the destroyed data can be restored by reading data out of the other HDD 904.

When requested by one of the upper host systems 601 to write data, the RAID controller 501 thus stores the data requested to be written and data that provides redundancy to the requested data in a plurality of HDDs 904 in a dispersed manner. If the written data is destroyed, the destroyed data can be restored from the data that provides redundancy to the written data. Data that provides redundancy to data requested to be written is the same data as the one requested to be written, or parity calculated from the data requested to be written.

The RAID controller 501 has an upper host system I/F unit 901, a cache memory unit 902, and a disk drive control unit 903. Creation of parity data and restoration of destroyed data are executed by the disk drive control unit 903.

This invention can be applied to the RAID system shown in FIG. 9 by replacing the HDDs 904 of FIG. 9 with the flash drives 502.

Figure 5:
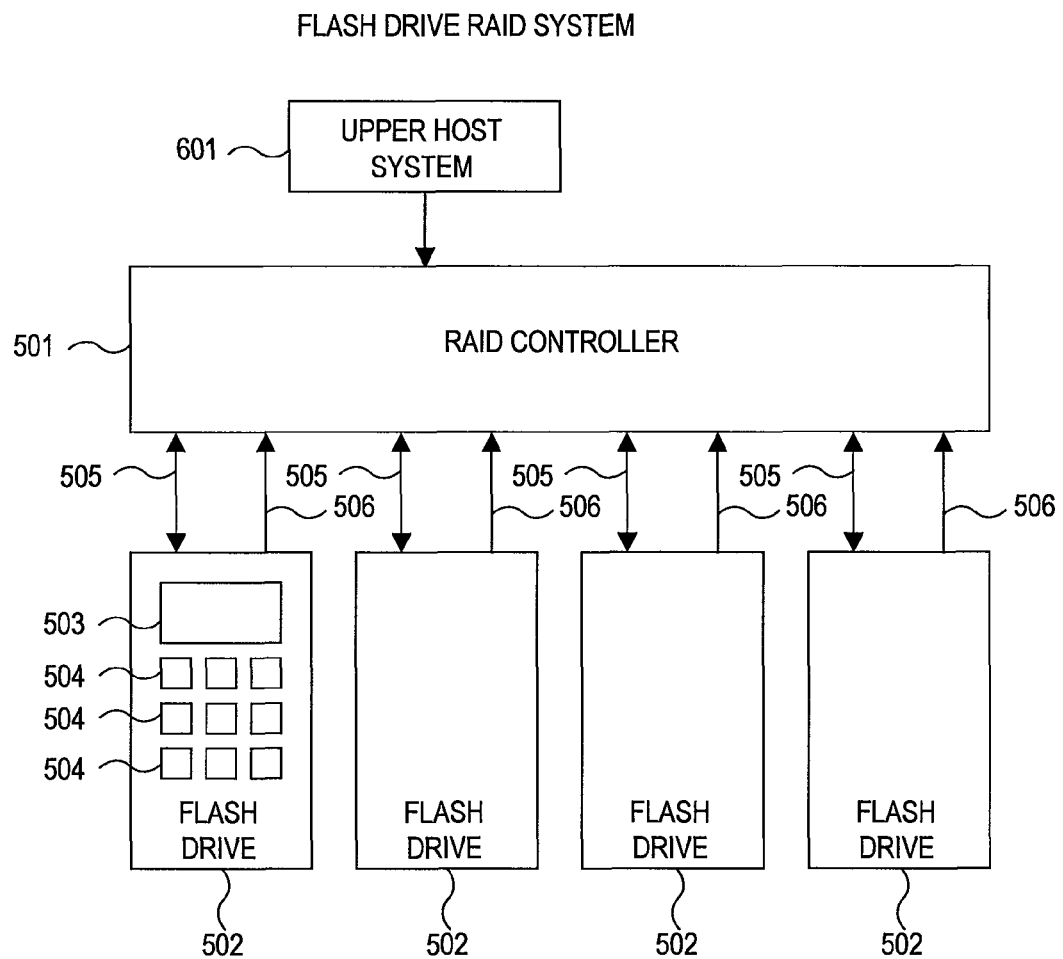
FIG. 5 is a block diagram showing the configuration of a flash drive RAID system according to a third embodiment of this invention.

FIG. 5 is a block diagram showing the configuration of a flash drive RAID system according to the third embodiment of this invention.

The flash drive RAID system shown in FIG. 5 is obtained by replacing the HDDs 904 of FIG. 9 with the flash drives 502.

In the system of FIG. 5, the flash memory controller 503 sends a notification about the detection of a data error that cannot be corrected by decoding an error correction code to the RAID controller 501 (or other upper systems) by sending an asynchronous signal 506. The asynchronous signal 506 is, for example, an interruption signal. Detecting the asynchronous signal 506 sent from one of the flash drives 502, the RAID controller 501 collects status information of the flash drive 502 or the like through the conventional information transmission unit 505, to thereby obtain address information of the destroyed user data. The RAID controller 501 uses data that provides redundancy to data, such as parity in RAID, to restore the destroyed data, and overwrites the flash drive 502 that has kept the destroyed data with the restored data. Restoration of data and writing of the restored data may be stalled until processing that is being processed at that point by the RAID controller 501 is completed.

Figure 15:
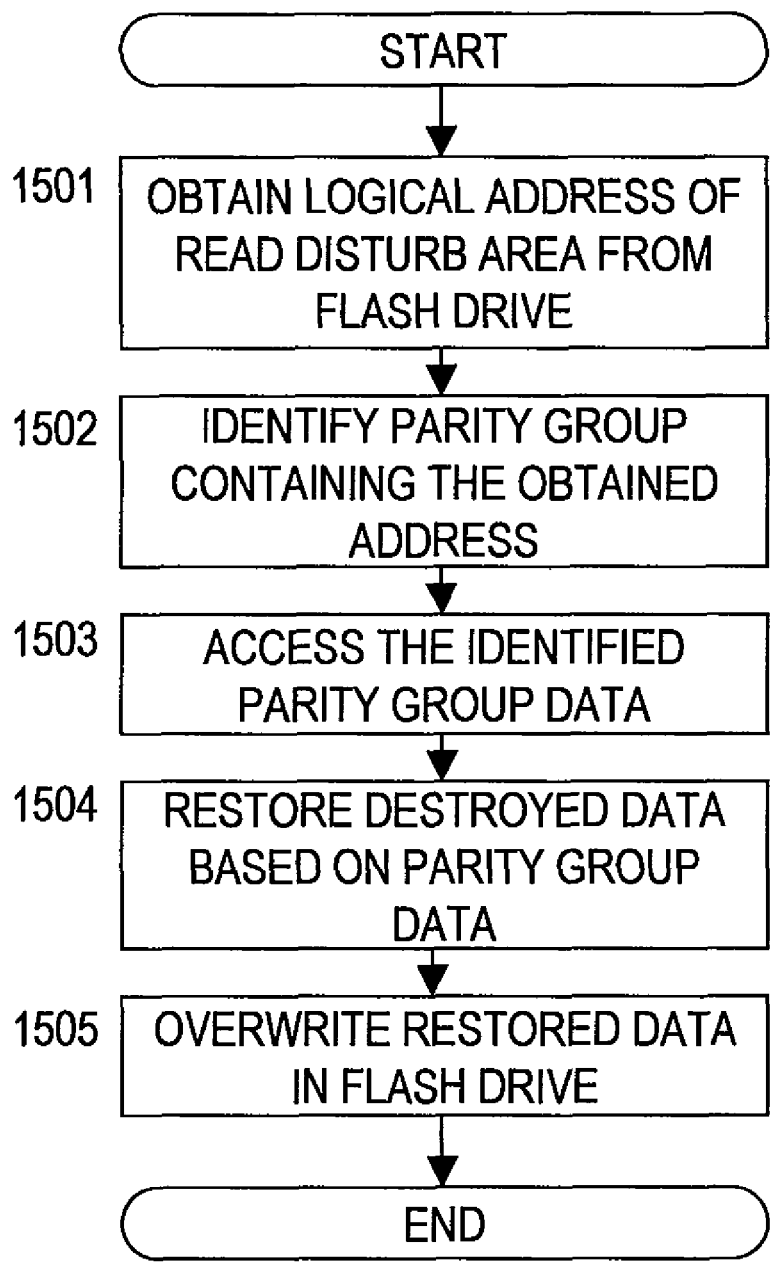
FIG. 15 is a flow chart for RAID system processing which is executed by a RAID controller according to the third embodiment of this invention.

The above processing follows a processing flow as the one shown in FIG. 15.

FIG. 15 is a flow chart for RAID system processing which is executed by the RAID controller 501 according to the third embodiment of this invention.

The processing of FIG. 15 is started when the RAID controller 501 receives an interruption signal or other irregular signals from the flash drive 502. An interruption signal from the flash drive 502 corresponds to the notification sent in Step 1416 of FIG. 14B. The interruption signal is irregular because an interruption from the flash drive 502 occurs only when error correction processing within the flash drive 502 is found to be impossible through a read disturb check accompanying the read processing of the RAID controller 501.

Detecting read disturb that cannot be corrected by error correction within the flash drive 502 from an interruption signal or the like sent from the flash drive 502, the RAID controller 501 obtains the logical address of the page 204 that contains data suffering the read disturb from the flash drive 502 (Step 1501). The RAID controller 501 may use a conventional I/F or a dedicated I/F to obtain the logical address. The logical address is contained in, for example, the notification sent in Step 1416 of FIG. 14B.

After the logical address of the page 204 where the read disturb has occurred is obtained, the RAID controller 501 identifies a parity group that contains data stored at the obtained logical address (Step 1502), and reads other data in the identified parity group than the data stored at the logical address out of another flash drive 502 (Step 1503). For example, in the case where RAID-5 is built from 3D+1P, when read disturb occurs in and destroys data A out of A, B, and C of 3D, the RAID controller 501 reads data of B, C, and P and calculates the exclusive OR of the read data, to thereby restore the data A (Step 1504). The RAID controller 501 thus restores the data having the obtained logical address from the read data of the parity group, and writes the restored data in the flash drive 502 that has stored the data having the obtained logical address (Step 1505). In this write operation, as in prior art, the data is written in a physically separate page 204 that has been erased of data in advance, and the data is not written back to the page 204 where the read disturb has occurred.

When the flash drive 502 is overwritten with data through write access, the data is written in a different page 204 than the one that has originally held the data, which changes conditions for causing read disturb and the like (e.g., the likeliness of read disturb happening).

As described above, according to the third embodiment of this invention, data can be restored with the RAID function when an error that cannot be corrected by the flash memory controller 503 is detected. The reliability of a storage system that uses the flash drive 502 can thus be improved.

A fourth embodiment of this invention will be described next with reference to FIG. 6.

The following description addresses differences between the third embodiment and the fourth embodiment while omitting description common to the third and fourth embodiments.

Figure 6:
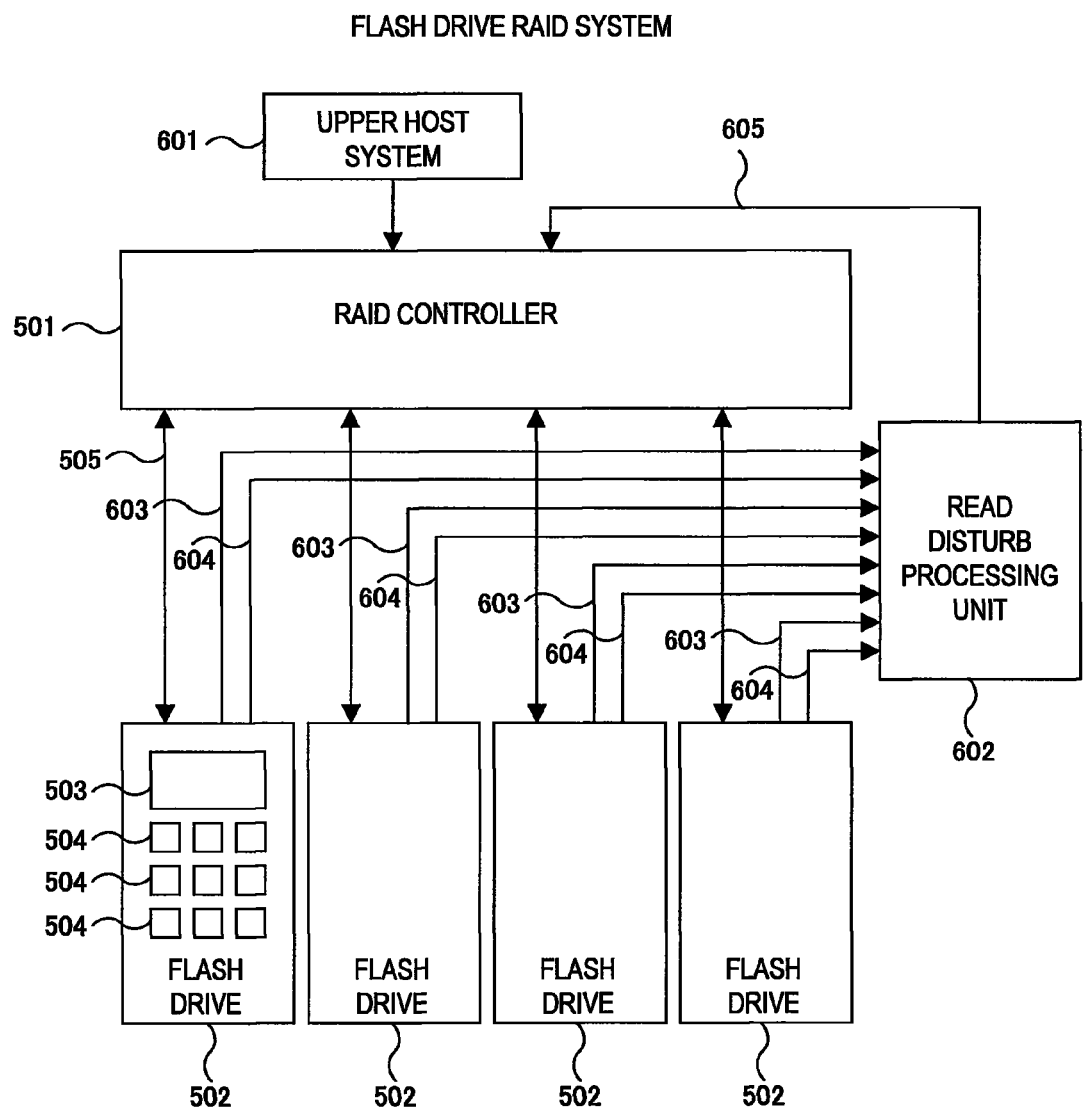
FIG. 6 is a block diagram showing a configuration of a flash drive RAID system according to a fourth embodiment of this invention.

FIG. 6 is a block diagram showing the configuration of a flash drive RAID system according to the fourth embodiment of this invention.

The RAID controller 501 in a RAID system that is designed for the conventional HDDs 904 is not capable of operating the HDDs 904 as requested by asynchronous interruption requests from the HDDs 904.

In view of this, the flash drives 502 of the fourth embodiment are connected to a read disturb processing unit 602 via an interruption output signal 603 and the information transmission unit 604. The read disturb processing unit 602 is a control device connected in a communicable manner with the RAID controller 501 and the flash drives 502.

The read disturb processing unit 602 receives an interruption signal from one of the flash drives 502, and collects address information of the destroyed user data from this flash drive 502 through the information transmission unit 604. The read disturb processing unit 602 then creates a group of commands directed to the RAID controller 501 to instruct read and write of the destroyed user data. Specifically, the read disturb processing unit 602 creates a command for reading the user data at the address collected via the information transmission unit 604, and a command for writing the read user data.

The read disturb processing unit 602 sends the created commands to the RAID controller 501 via an information transmission unit 605. The RAID controller 501 processes the command group received from the read disturb processing unit 602 as a command group that is received from one of the plurality of upper host systems 601.

The information transmission unit 604 may be similar to the information transmission unit 505 placed between the RAID controller 501 and each flash drive 502 (for example, a Fibre Channel interface). The information transmission unit 605 may be similar to an information transmission unit placed between the RAID controller 501 and each upper host system 601 (for example, a Fibre Channel interface).

The RAID controller 501 reads the destroyed user data following the read command received from the read disturb processing unit 602. In return, the flash drive 502 sends error information. The RAID controller 501 judges from this error information that the user data to be read is unusable, and restores the user data to be read from parity of the RAID. After that, the RAID controller 501 writes the restored user data in the flash drive 502 following the write command received from the read disturb processing unit 602.

At this point, a RAID system that uses the conventional HDDs 904 may cut off the HDD 904 where the error has occurred and use a spare HDD 904. The RAID controller 501 of this embodiment, on the other hand, bases its judgment on error information sent from the flash drives 502 and, when the user data is found to be destroyed, overwrites the original flash drive 502 with the restored user data instead of cutting off the flash drive 502 from a parity group of the RAID.

When the flash drive 502 is overwritten with data through write access, the data is written in a different page 204 than the one that has originally held the data, which changes conditions for causing read disturb and the like.

Instead of the read disturb processing unit 602, an interruption processing unit (not shown in the drawing) may receive an interruption from one of the flash drives 502 and send, to the RAID controller 501, as an instruction from one of the upper host systems 601, a special command for repairing the data portion that cannot be corrected by error correction.

As described above, according to the fourth embodiment of this invention, the read disturb processing unit 602 receives an interruption signal from one of the flash drives 502 when an error that cannot be corrected by the flash memory controller 503 is detected, and issues a read command and a write command to the RAID controller 501 based on the interruption signal. This invention can therefore be carried out by connecting the flash drives 502 to the conventional RAID controller 501 (a RAID controller that is designed for the HDDs 904) and further connecting the read disturb processing unit 602 to the RAID controller 501 and the flash drives 502. In short, a highly reliable storage system according to this invention is obtained without modifying the conventional RAID controller 501.

The above-described embodiments of this invention make it possible to apply flash memories to a RAID system that requires high reliability. The embodiments also make it possible to apply flash memories that do not have much resistance against read disturb to RAID systems. This improves the yield of flash memories and the cost of flash memories can thus be reduced.

Protection in a flash drive that is equipped with a plurality of flash memories against read disturb and protection in a RAID system against read disturb ensures high reliability for a storage system.

While the present invention has been described in detail and pictorially in the accompanying drawings, the present invention is not limited to such detail but covers various obvious modifications and equivalent arrangements, which fall within the purview of the appended claims.

What is claimed is:

1. A non-volatile data storage apparatus, comprising:
a plurality of memory chips; and
a memory controller coupled to the plurality of memory chips
wherein each of the memory chips includes a plurality of management areas,
wherein the memory controller is configured to:
write, in the plurality of memory chips, data and an error correction code calculated from the data;
count the number of data read processing for each of the management areas;
read, when the number of data read processing that is counted for a first management area of the plurality of management areas, exceeds a first threshold, the data and the error correction code that are stored in the first management area;
decode the error correction code read from the first management area; and
write the data corrected by decoding the error correction code in other management areas than the first management area,
wherein the first threshold is decreased with increasing an erase count in the first management area.

2. A non-volatile data storage apparatus, comprising:
a plurality of memory cells; and
a memory controller coupled to the plurality of memory cells, for controlling data write and read in the plurality of memory cells,
wherein each of the memory cells includes a field effect transistor having a floating gate,
wherein each of the memory cells is included in one of a plurality of management areas,
wherein the management areas each include at least two of the memory cells, and
wherein the memory controller is configured to:
write, in the plurality of memory cells, data and an error correction code calculated from the data;
count, for each of the management areas, how many times data read processing has been executed in the memory cells within the management area;
read, when the data read processing count that is counted for a first management area, which is one of the plurality of management areas, exceeds a first threshold, the data and the error correction code that are stored in the memory cells within the first management area;
decode the error correction code read from the first management area; and
write, when a count of errors included in the read data exceeds a second threshold, the data corrected by decoding the error correction code in other management areas than the first management area,
wherein the memory controller is further configured to:
count how many times the processing of writing corrected data in other management areas than the first management area has been executed as a result of the error count of data read out of the first management area exceeding the second threshold; and
use, when the execution count of the processing of writing corrected data in other management areas than the first management area exceeds a fifth threshold, a sixth threshold in place of the first threshold, the sixth threshold being smaller than the first threshold.

3. The non-volatile data storage apparatus according to claim 1, wherein the memory controller is further configured to use, when the data read processing count that is counted for the first management area exceeds a seventh threshold, an eighth threshold in place of the first threshold, the eighth threshold being smaller than the first threshold.

4. The non-volatile data storage apparatus according to claim 1,
wherein the plurality of memory chips include memory chips of a NAND flash memory, and wherein each of the management areas includes the field effect transistor in a plurality of numbers, the plurality of the field effect transistors being connected in series and individually belonging to different pages, and the field effect transistor in a plurality of numbers included in each of the pages.

5. A non-volatile data storage apparatus, comprising:
a plurality of memory cells; and
a memory controller coupled to the plurality of memory cells, for controlling data write and read in the plurality of memory cells,
wherein each of the memory cells includes a field effect transistor having a floating gate,
wherein each of the memory cells is included in one of a plurality of management areas,
wherein the management areas each include at least two of the memory cells, and
wherein the memory controller is configured to:
write, in the plurality of memory cells, data and an error correction code calculated from the data;
count, for each of the management areas, how many times data read processing has been executed in the memory cells within the management area;
read, when the data read processing count that is counted for a first management area, which is one of the plurality of management areas, exceeds a first threshold, the data and the error correction code that are stored in the memory cells within the first management area;
decode the error correction code read from the first management area; and
write, when a count of errors included in the read data exceeds a second threshold, the data corrected by decoding the error correction code in other management areas than the first management area,
wherein the non-volatile data storage apparatus is coupled to a host device for sending a data write request and a data read request to the non-volatile data storage apparatus, and
wherein the memory controller is further configured to send, when the data read out of the memory cells in the first management area includes an error that cannot be corrected by decoding the error correction code, information indicating an address assigned to an area in which the error that cannot be corrected by decoding of the error correction code has been written to the host device.

6. A storage system, comprising:
a plurality of non-volatile data storage apparatuses; and
a storage controller for sending a data write request and a data read request to the plurality of non-volatile data storage apparatuses,
wherein the storage controller writes, in at least one of the plurality of non-volatile data storage apparatuses, data that provides redundancy to data written in at least one of the non-volatile data storage apparatuses, which exclude the at least one non-volatile data storage apparatus holding the redundant data,
wherein each of the non-volatile data storage apparatuses has a plurality of memory cells and a memory controller coupled to the plurality of memory cells, for controlling data write and read in the memory cells,
wherein each of the memory cells includes a field effect transistor having a floating gate,
wherein each of the memory cells is included in one of a plurality of management areas,
wherein the management areas each include at least two of the memory cells,
wherein the memory controller is configured to:
write, in the plurality of memory cells, data requested by the storage controller to be written and an error correction code calculated from the data;
count, for each of the management areas, how many times data read processing has been executed in the memory cells within the management area;
read, when the data read processing count that is counted for a first management area, which is one of the plurality of management areas, exceeds a first threshold, the data and the error correction code that are stored in the memory cells within the first management area;
decode the read error correction code;
write, when a count of errors included in the read data exceeds a second threshold, the data corrected by decoding the error correction code in other management areas than the first management area; and
send, when the read data includes an error that cannot be corrected by decoding the error correction code, information indicating an address assigned to an area that holds the data including the error that cannot be corrected by decoding of the error correction code, and
wherein the storage controller is configured to:
send, to the plurality of non-volatile data storage apparatuses, a data read request for the area that holds the data including the error that cannot be corrected by decoding of the error correction code and an area that holds data for providing redundancy to the data including the error that cannot be corrected by decoding of the error correction code;
restore the data including the error that cannot be corrected by decoding of the error correction code from the data read in response to the read request; and
send, to the plurality of non-volatile data storage apparatuses, a request to write the restored data and data that provides redundancy to the restored data.

7. The storage system according to claim 6, further comprising:
a control device which is coupled to the plurality of non-volatile data storage apparatuses and to the storage controller,
wherein the memory controller is further configured to send, when the read data includes an error that cannot be corrected by decoding the error correction code, to the control device, information indicating an address assigned to an area that holds the data including the error that cannot be corrected by decoding of the error correction code,
wherein the control device is configured to send, to the storage controller, a read request for the area that holds the data including the error that cannot be corrected by decoding of the error correction code, and
wherein the storage controller is further configured to send, in response to the read request received from the control device, to the plurality of non-volatile data storage apparatuses, a data read request for the area that holds the data including the error that cannot be corrected by decoding of the error correction code and an area that holds data for providing redundancy to the data including the error that cannot be corrected by decoding of the error correction code.

8. The storage system according to claim 6, wherein the data that provides redundancy to the data written in at least one of the non-volatile data storage apparatuses is one of the same data as the data written in the at least one of the non-volatile data storage apparatuses and parity calculated from the data written in the at least one of the non-volatile data storage apparatuses.

9. A method of controlling a storage system including a non-volatile data storage apparatus that has a plurality of memory chips and a memory controller which is coupled to the plurality of memory chips, each of the memory chips includes a plurality of management areas, the method comprising the steps of:
writing, by the memory controller, data and an error correction code, which is calculated from the data, in the plurality of memory chips;
counting, by the memory controller, the number of data read processing for each of the management areas
reading, by the memory controller, when the number of data read processing is counted for a first management area, which is one of the plurality of management areas, exceeds a first threshold, the data and the error correction code that are stored in the first management area;
decoding, by the memory controller, the error correction code read from the first management area; and
writing, by the memory controller, the data corrected by decoding the error correction code in other management areas than the first management area,
wherein the first threshold is decreased with increasing an erase count in the first management area.

10. A method of controlling a storage system including a non-volatile data storage apparatus that has a plurality of memory cells and a memory controller which is coupled to the plurality of memory cells, for controlling data write and read in the memory cells, each of the memory cells being a field effect transistor with a floating gate and included in one of a plurality of management areas, the management areas each including at least two of the memory cells, the method comprising the steps of:
writing, by the memory controller, data and an error correction code, which is calculated from the data, in the plurality of memory cells;
counting, by the memory controller, for each of the management areas, how many times data read processing has been executed in the memory cells within the management area;
reading, by the memory controller, when the data read processing count of a first management area, which is one of the plurality of management areas, exceeds a first threshold, the data and the error correction code that are stored in the memory cells within the first management area;
decoding, by the memory controller, the read error correction code;
writing, by the memory controller, when a count of errors included in the read data exceeds a second threshold, the data corrected by decoding the error correction code in other management areas than the first management area; and
counting, by the memory controller, how many times the processing of writing corrected data in other management areas than the first management area has been executed as a result of the error count of data read out of the first management area exceeding the second threshold,
wherein, when the execution count of the processing of writing corrected data in other management areas than the first management area exceeds a fifth threshold, the memory controller uses a sixth threshold in place of the first threshold, the sixth threshold being smaller than the first threshold.

11. The storage system control method according to claim 9, wherein, when the data read processing count that is counted for the first management area exceeds a seventh threshold, the memory controller uses an eighth threshold in place of the first threshold, the eighth threshold being smaller than the first threshold.

12. The storage system control method according to claim 9,
wherein the plurality of memory chips include memory cells of a NAND flash memory, and
wherein each of the management areas includes the field effect transistor in a plurality of numbers, the plurality of the field effect transistors being connected in series and individually belonging to different pages, and the field effect transistor in a plurality of numbers included in each of the pages.

13. A method of controlling a storage system including a non-volatile data storage apparatus that has a plurality of memory cells and a memory controller which is coupled to the plurality of memory cells, for controlling data write and read in the memory cells, each of the memory cells being a field effect transistor with a floating gate and included in one of a plurality of management areas, the management areas each including at least two of the memory cells, the method comprising the steps of:
writing, by the memory controller, data and an error correction code, which is calculated from the data, in the plurality of memory cells;
counting, by the memory controller, for each of the management areas, how many times data read processing has been executed in the memory cells within the management area;
reading, by the memory controller, when the data read processing count of a first management area, which is one of the plurality of management areas, exceeds a first threshold, the data and the error correction code that are stored in the memory cells within the first management area;
decoding, by the memory controller, the read error correction code; and
writing, by the memory controller, when a count of errors included in the read data exceeds a second threshold, the data corrected by decoding the error correction code in other management areas than the first management area,
wherein the non-volatile data storage apparatus is coupled to a host device for sending a data write request and a data read request to the non-volatile data storage apparatus, and
wherein the method further comprises the step of sending, by the memory controller, when the data read out of the memory cells in the first management area includes an error that cannot be corrected by decoding the error correction code, information indicating an address assigned to an area in which the error that cannot be corrected by decoding of the error correction code has been written to the host device.

14. The storage system control method according to claim 13, wherein the storage system includes the non-volatile data storage apparatuses in a plurality of numbers,
wherein the host device includes a storage controller for sending a data write request and a data read request to the plurality of non-volatile data storage apparatuses,
wherein the storage controller writes, in at least one of the plurality of non-volatile data storage apparatuses, data that provides redundancy to data written in at least one of the non-volatile data storage apparatuses, which exclude the at least one non-volatile data storage apparatus holding the redundant data, wherein the step of writing, by the memory controller, data and an error correction code, which is calculated from the data, in the plurality of memory cells is executed in response to the data write request sent from the storage controller, and wherein the method further comprises the steps of:

sending, by the storage controller, to the plurality of non-volatile data storage apparatuses, a data read request for the area that holds the data including the error that cannot be corrected by decoding of the error correction code and an area that holds data for providing redundancy to the data including the error that cannot be corrected by decoding of the error correction code;

restoring, by the storage controller, the data including the error that cannot be corrected by decoding of the error correction code from the data read in response to the read request; and sending, by the storage controller, to the plurality of non-volatile data storage apparatuses, a request to write the restored data and data that provides redundancy to the restored data.

15. The storage system control method according to claim 14, wherein the host device further includes a control device coupled to the plurality of non-volatile data storage apparatuses and to the storage controller, wherein the method further comprises the steps of:

receiving, by the control device, information indicating an address assigned to the area that holds the data including the error that cannot be corrected by decoding of the error correction code; and sending, by the control device, to the storage controller, a read request for the area that holds the data including the error that cannot be corrected by decoding of the error correction code, and wherein the step of sending, by the storage controller, a data read request to the plurality of non-volatile data storage apparatuses is executed in response to the read request received from the control device.

16. The storage system control method according to claim 14, wherein the data that provides redundancy to the data written in at least one of the non-volatile data storage apparatuses is one of the same data as the data written in the at least one of the non-volatile data storage apparatuses and parity calculated from the data written in the at least one of the non-volatile data storage apparatuses.

17. A storage system comprising:

a plurality of non-volatile data storage apparatus; and a storage controller coupled to the plurality of non-volatile data storage apparatus, wherein each non-volatile data storage apparatus comprises:

a plurality of memory chips, and a memory controller coupled to the plurality of memory chips, wherein each of the memory chips includes a plurality of management areas, wherein the memory controller is configured to:

write, in the plurality of memory chips, data and an error correction code calculated from the data;

count the number of data read processing for each of the management areas;

read, when the number of data read processing that is counted for a first management area of the plurality of management areas, exceeds a first threshold, the data and the error correction code that are stored in the first management area;

decode the error correction code read from the first management area; and write the data corrected by decoding the error correction code in other management areas than the first management area, wherein the first threshold is decreased with increasing an erase count in the first management area.

18. The storage system according to claim 17, wherein the storage controller sends a data write request and a data read request to the plurality of non-volatile data storage apparatus, wherein the storage controller writes, in at least one of the plurality of non-volatile data storage apparatuses, data that provides redundancy to data written in at least one of the plurality of non-volatile data storage apparatus, which exclude the at least one of the plurality of non-volatile data storage apparatus holding the redundant data, wherein the memory controller is further configured to:

send, when the read data includes an error that cannot be corrected by decoding the error correction code, information indicating an address assigned to an area that holds the data including the error that cannot be corrected by decoding of the error correction code, and wherein the storage controller is configured to:

send, to the plurality of non-volatile data storage apparatuses, a data read request for the area that holds the data including the error that cannot be corrected by decoding of the error correction code and an area that holds data for providing redundancy to the data including the error that cannot be corrected by decoding of the error correction code, restore the data including the error that cannot be corrected by decoding of the error correction code from the data read in response to the read request, and send, to the plurality of non-volatile data storage apparatuses, a request to write the restored data and data that provides redundancy to the restored data.

* * * * *